US010340737B2

(12) United States Patent
Jung et al.

(10) Patent No.: US 10,340,737 B2
(45) Date of Patent: Jul. 2, 2019

(54) ELECTRONIC DEVICE AND METHOD FOR CONTROLLING FAN OF ELECTRONIC DEVICE

(71) Applicant: Samsung Electronics Co., Ltd., Gyeonggi-do (KR)

(72) Inventors: Ku-Chul Jung, Seoul (KR); Kyung-Ha Koo, Seoul (KR); Chul-Woo Park, Gyeonggi-do (KR); Ki-Youn Jang, Gyeonggi-do (KR); Yong-Sang Yun, Gyeonggi-do (KR); Chi-Hyun Cho, Gyeonggi-do (KR)

(73) Assignee: Samsmg Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 247 days.

(21) Appl. No.: 15/233,130

(22) Filed: Aug. 10, 2016

(65) Prior Publication Data

US 2017/0047784 A1    Feb. 16, 2017

(30) Foreign Application Priority Data

Aug. 12, 2015    (KR) .......................... 10-2015-0114161

(51) Int. Cl.
*G06F 1/20*    (2006.01)
*G06F 1/26*    (2006.01)
(Continued)

(52) U.S. Cl.
CPC .............. *H02J 50/12* (2016.02); *G06F 1/206* (2013.01); *G06F 1/26* (2013.01); *H02J 7/025* (2013.01);
(Continued)

(58) Field of Classification Search
CPC .. H02J 50/12; H02J 7/025; G06F 1/26; H05K 7/20209
See application file for complete search history.

(56) References Cited

U.S. PATENT DOCUMENTS

2012/0223590 A1    9/2012    Low et al.
2014/0007594 A1    1/2014    Lofy et al.
(Continued)

FOREIGN PATENT DOCUMENTS

CN    103915905 A    7/2014
CN    104242479 A    12/2014
(Continued)

OTHER PUBLICATIONS

International Search Report dated Nov. 11, 2016.
European Search Report dated Jul. 5, 2018.
Chinese Search Report dated Mar. 4, 2019.

*Primary Examiner* — Jared Fureman
*Assistant Examiner* — Duc M Pham
(74) *Attorney, Agent, or Firm* — Cha—Reiter, LLC

(57) ABSTRACT

According to various embodiments, an electronic device for charging a battery of an external device may include a coil and a first circuit configured to wirelessly transmit power to the external device through the coil. A second circuit may be configured to wirelessly receive information from the external device. A fan may be disposed adjacent to the coil to discharge heat to the exterior of the electronic device. A control circuit may adjust the driving speed of the fan based at least in part on the received information.

17 Claims, 13 Drawing Sheets

(51) Int. Cl.
    *H02J 7/02*         (2016.01)
    *H05K 7/20*        (2006.01)
    *H02J 50/12*       (2016.01)
    *H02J 50/80*       (2016.01)

(52) U.S. Cl.
    CPC .......... *H02J 50/80* (2016.02); *H05K 7/20209* (2013.01)

(56) References Cited

U.S. PATENT DOCUMENTS

| | | |
|---|---|---|
| 2014/0070749 A1 | 3/2014 | Chiu |
| 2014/0167522 A1 | 6/2014 | Lee |
| 2014/0191717 A1* | 7/2014 | Hong ................ H02J 5/005 320/108 |
| 2014/0365807 A1 | 12/2014 | Nakano |
| 2016/0181849 A1* | 6/2016 | Govindaraj ............ H02J 7/025 320/108 |
| 2017/0182852 A1* | 6/2017 | Makin ................ B60C 23/0469 |
| 2017/0363581 A1* | 12/2017 | Makin .................... G01N 29/04 |

FOREIGN PATENT DOCUMENTS

| | | |
|---|---|---|
| CN | 104471508 A | 3/2015 |
| JP | 2014-204449 A | 10/2014 |
| KR | 20-0340838 Y1 | 2/2004 |
| KR | 10-0961624 B1 | 6/2010 |
| KR | 10-2014-0065090 A | 5/2014 |
| KR | 10-2014-0077801 A | 6/2014 |
| KR | 10-2014-0144656 A | 12/2014 |
| KR | 10-2015-0021318 A | 3/2015 |

\* cited by examiner

ELECTRONIC DEVICE AND METHOD FOR CONTROLLING FAN OF ELECTRONIC DEVICE

CLAIM OF PRIORITY

This application claims the priority under 35 U.S.C. § 119(a) to Korean Application Serial No. 10-2015-0114161, which was filed in the Korean Intellectual Property Office on Aug. 12, 2015, the entire content of which is hereby incorporated by reference.

TECHNICAL FIELD

The present disclosure relates generally to wireless charging, and, more particularly, to an electronic device in a wireless charging system, and a fan control method of the electronic device.

BACKGROUND

Mobile terminals, such as mobile phones or PDAs (Personal Digital Assistants), are driven by a rechargeable battery according to their features, and, in order to charge the battery, electrical energy is supplied to the battery of the mobile terminal by a separate charging device. Typically, the charging device and the battery have separate contact terminals, respectively, which allows the charging device and the battery to be electrically connected to each other by bringing the charging device into contact with the battery.

Since the contact terminals are exposed to the outside in the contact type of charging, the terminals are easily contaminated by foreign materials, which may cause a malfunction in the battery charging. In addition, in the case where the contact terminals are exposed to moisture, the charging may not be conducted correctly.

Recently, in order to solve the problems above, wireless charging technology (also called non-contact charging technology) has been developed and widely utilized in various electronic devices.

Wireless charging technology provides a system that uses wireless power transmission and reception in which, for example, the battery of a mobile phone may be automatically charged by simply placing the mobile phone on a charging pad without connecting to a separate charging connector. In general, wireless charging technology is well known to the public in other applications such as for charging wireless electric toothbrushes or wireless electric shavers. Wireless charging technology can enhance a device's waterproof function by eliminating the need for exposed terminals on the device for wired charging. Portability of the device is also improved since a wired charger is unnecessary to transport. Related technology is also expected to rapidly advance in the coming electric vehicle era.

Wireless charging technology generally uses an electromagnetic induction method using coils, a resonance method, and/or a radio wave radiation (RF/Microwave radiation) method in which electrical energy is converted into microwaves to be transmitted.

SUMMARY

In a conventional wireless charging system, when a wireless power transmitting device generates and transmits power required by a receiving device, the transmitting device may emit heat. In order to transfer the heat emitted during the generation and transmission of the wireless power to the exterior, the transmitting device may include one or more fans.

In the conventional wireless charging system, the transmitting device adjusts the driving speed of a fan only by considering the generated amount of power or heat (temperature) detected in the device. The amount of heat that radiates from the device may depend on the amount of power transmitted during the wireless charging. The driving of a fan to transfer the radiated heat to the outside may also bring about noise.

Various embodiments of the present disclosure may provide a device and a method that adjusts the fan speed through feedback control using information received from the receiving device during the wireless charging. The driving speed of a fan may be adjusted depending on the transmit power level, which may be set based on charging configuration information received from the receiving device.

According to various embodiments of the present disclosure, an electronic device may include a coil, a first circuit configured to wirelessly transmit power to an external device through the coil, and a second circuit configured to wirelessly receive information from the external device. A fan may be disposed adjacent to the coil to discharge heat to the outside of the electronic device. A control circuit may be configured to adjust the driving speed of the fan based at least in part on at least some of the received information.

According to various embodiments of the present disclosure, a fan control method of an electronic device having a fan and a coil may involve wirelessly transmitting power to an external device through the coil; wirelessly receiving information from the external device; and adjusting the driving speed of the fan based at least in part on at least some of the received information.

According to various embodiments of the present disclosure, an electronic device may include a coil, a battery, and a first circuit electrically connected to the battery and configured to wirelessly receive power from a wireless charging device through the coil. A second circuit may be configured to wirelessly transmit information to the wireless charging device. The device may further include a memory and a processor operably coupled to the first circuit, the second circuit, and the memory. The memory may store instructions that, when executed by the processor, cause the processor to transmit, to the wireless charging device via the second circuit, information related to a battery state of the electronic device or an external environment of the electronic device, or time information, when the wireless charging device is positioned adjacent to the coil.

According to various embodiments of the present disclosure, since the charging device transmits power based at least in part on the charging configuration information received from the receiving device, and since the electronic device adjusts and transmits the amount of power based on the received information when receiving information according to a charging state change of the external electronic device, it is possible to prevent power from being wasted and to reduce resources that are required for generating the power.

In addition, it is possible to prevent a temperature rise of the electronic device otherwise caused by the heat emitted from the electronic device and to minimize the noise generated by the driving of a fan by configuring the driving speed of a fan of the electronic device depending on the amount of power based on the received information.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
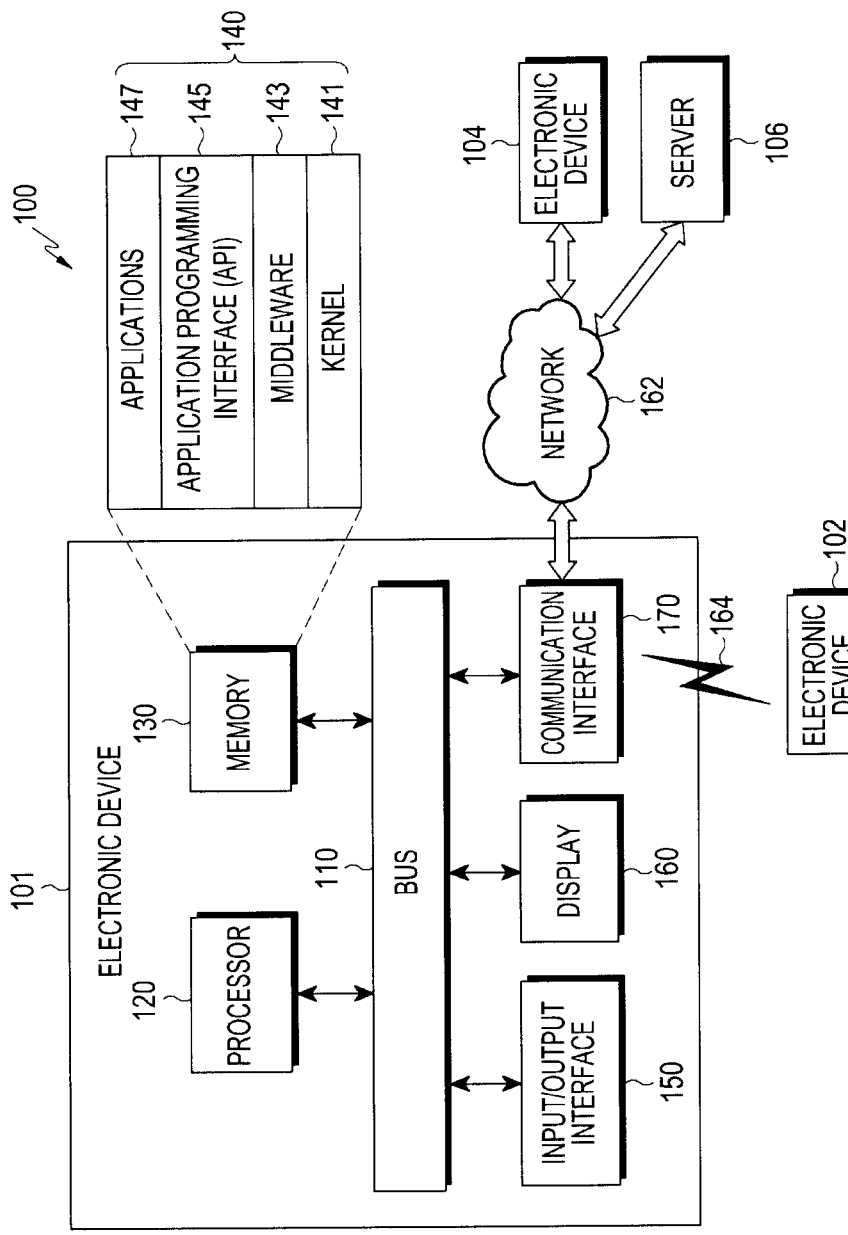
FIG. 1 illustrates an electronic device in a network environment, according to various embodiments.

Hereinafter, various embodiments of the present document will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

In the present disclosure, the expression "have", "may have", "include" or "may include" refers to existence of a corresponding feature (e.g., numerical value, function, operation, or components such as elements), and does not exclude existence of additional features.

In the present disclosure, the expression "A or B", "at least one of A or/and B", or "one or more of A or/and B" may include all possible combinations of the items listed. For example, the expression "A or B", "at least one of A and B", or "at least one of A or B" may include (1) at least one A, (2) at least one B, or (3) both at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

As used herein, the expression "configured to" may be interchangeably used with the expression "suitable for", "having the capability to", "designed to", "adapted to", "made to", or "capable of". The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. A singular expression may include a plural expression unless they are definitely different in a context. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head- Mounted Device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The smart home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). In various embodiments, the electronic device may be a combination of one or more of the aforementioned various devices. According to some embodiments, the electronic device may also be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. In the present disclosure, the term "user" may indicate a person using an electronic device or a device (e.g., an artificial intelligence electronic device) using an electronic device.

Referring to FIG. 1, the electronic device 101, according to various embodiments, in a network environment 100 is disclosed. The electronic device 101 may include a bus 110, a processor 120, a memory 130, an input/output interface 150, a display 160, and a communication interface 170. In some embodiments, the electronic device 101 may exclude one or more elements or may add other elements thereto.

The bus 110, for example, may include a circuit for connecting the elements 120, 130, 150 to 170 with each other and transferring communication data (e.g., control messages and/or data) between the elements.

The processor 120 may include at least one of a central processing unit (CPU), an application processor (AP), or a communication processor (CP). The processor 120, for example, may process a calculation or data that is related to the control and/or communication of one or more other elements of the electronic device 101. The processor 120 may be referred to as a controller, and may include the controller as a part thereof, or may constitute the controller.

The memory 130 may include a volatile and/or non volatile memory. For example, the memory 130 may store instructions or data in relation to one or more other elements of the electronic device 101. According to various embodiments of the present disclosure, the memory 130 may store software and/or programs 140. For example, the programs 140 may include a kernel 141, middleware 143, an application programming interface (API) 145, and/or an application programs (or "applications") 147. At least some of the kernel 141, the middleware 143, or the API 145 may be referred to as an operating system (OS).

The kernel 141, for example, may control or manage system resources (e.g., the bus 110, the processor 120, or the memory 130), which are used to execute the operation or function that is implemented in other programs (e.g., the middleware 143, the API 145, or the application programs 147). In addition, the kernel 141 may provide an interface by which the middleware 143, the API 145, or the application programs 147 may access each element of the electronic device 101 for control or management.

The middleware 143 may play the intermediate role between the API 145 or the application programs 147 and the kernel 141 to communicate with each other for the transmission and reception of data.

In addition, the middleware 143 may process one or more operation requests that are received from the application programs 147 according to the priority. For example, the middleware 143 may give priority for using the system resources (e.g., the bus 110, the processor 120, or the memory 130) of the electronic device 101 to the one or more application programs 147. For example, the middleware 143 may perform scheduling or load balancing for the one or more operation requests by processing the one or more operation requests according to the priority given to the one or more application programs 147.

The API 145, for example, may be an interface by which the application programs 147 control functions that are provided by the kernel 141 or the middleware 143. For example, the API 145 may include one or more interfaces or functions (e.g., instructions) for file control, window control, image processing, or text control.

The input/output interface 150 may play the role of an interface that transfers instructions or data received from a user or other external devices to other elements of the electronic device 101. For example, the input/output interface 150 may output instructions or data received from the other elements of the electronic device 101 to the user or the other external devices.

The display 160, for example, may include a liquid crystal display (LCD), an LED (light emitting diode) display, an organic LED (organic light emitting diode) display, a micro electromechanical system (MEMS) display, or an electronic paper display. For example, the display 160 may display a variety of content (e.g., text, images, videos, icons, symbols, or the like) to the user. The display 160 may include a touch screen, and may receive a touch input, a gesture input, a proximity input, or a hovering input by using electronic pens or a user's body part.

The communication interface 170, for example, may configure communication between the electronic device 101 and external devices (e.g., the first external electronic device 102, the second external electronic device 104, or a server 106). For example, the communication interface 170 may be connected to the network 162 through wireless communication or wired communication in order to thereby communicate with the external devices (e.g., the second external electronic device 104, or the server 106). The communication interface 170 may include a communication processor (CP), and the communication processor may constitute one to a plurality of modules constituting the communication interface 170. In one embodiment, the communication processor may be included in the processor 120.

For example, the wireless communication may use, as a cellular communication protocol, at least one of LTE (long term evolution), LTE A (LTE Advance), CDMA (code division multiple access), WCDMA (wideband CDMA), a UMTS (universal mobile telecommunications system), WiBro (Wireless Broadband), GSM (Global System for Mobile Communications), or the like. In addition, the wireless communication, for example, may include a short range communication 164. The short range communication 164 may include at least one of WiFi, Bluetooth, NFC, or a GNSS (global navigation satellite system). The GNSS, for example, may include at least one of a GPS (global positioning system), a Glonass (global navigation satellite system), the Beidou Navigation Satellite System (hereinafter, "Beidou"), the Galileo, or the European global satellite based navigation system according to the usage area or bandwidth. Hereinafter, "GPS" may be interchangeably used with "GNSS" in the present specification. For example, the wired communication may include at least one of a USB (universal serial bus), an HDMI (high definition multimedia interface), RS 232 (recommended standard 232), or a POTS (plain old telephone service). The network 162 may include at least one of a telecommunication network, such as a computer network (e.g., LAN or WAN), the Internet, or a telephone network.

The first external device 102 and the second external device 104 may be the same as, or different from, the electronic device 101 in its type. According to an embodiment, the server 106 may include a group of one or more servers. According to various embodiments, at least some, or all, of the operations that are executed in the electronic device 101 may be executed by one or more other electronic devices (e.g., the electronic device 102 or 104, or the server 106). According to an embodiment, in the case where the electronic device 101 executes a specific function or service automatically or by request, the electronic device 101 may make a request to the other devices (e.g., the electronic device 102 or 104, or the server 106) for at least some of the functions related to the function or service additionally or instead of executing the same by itself. The other electronic devices (e.g., the electronic device 102 or 104, or the server 106) may execute the requested function or additional function, and may transfer the result thereof to the electronic device 101. The electronic device 101 may provide the requested function or service by providing the result or by additionally processing the same. To this end, for example, cloud computing, distributed computing, or client-server computing technology may be used.

Figure 2:
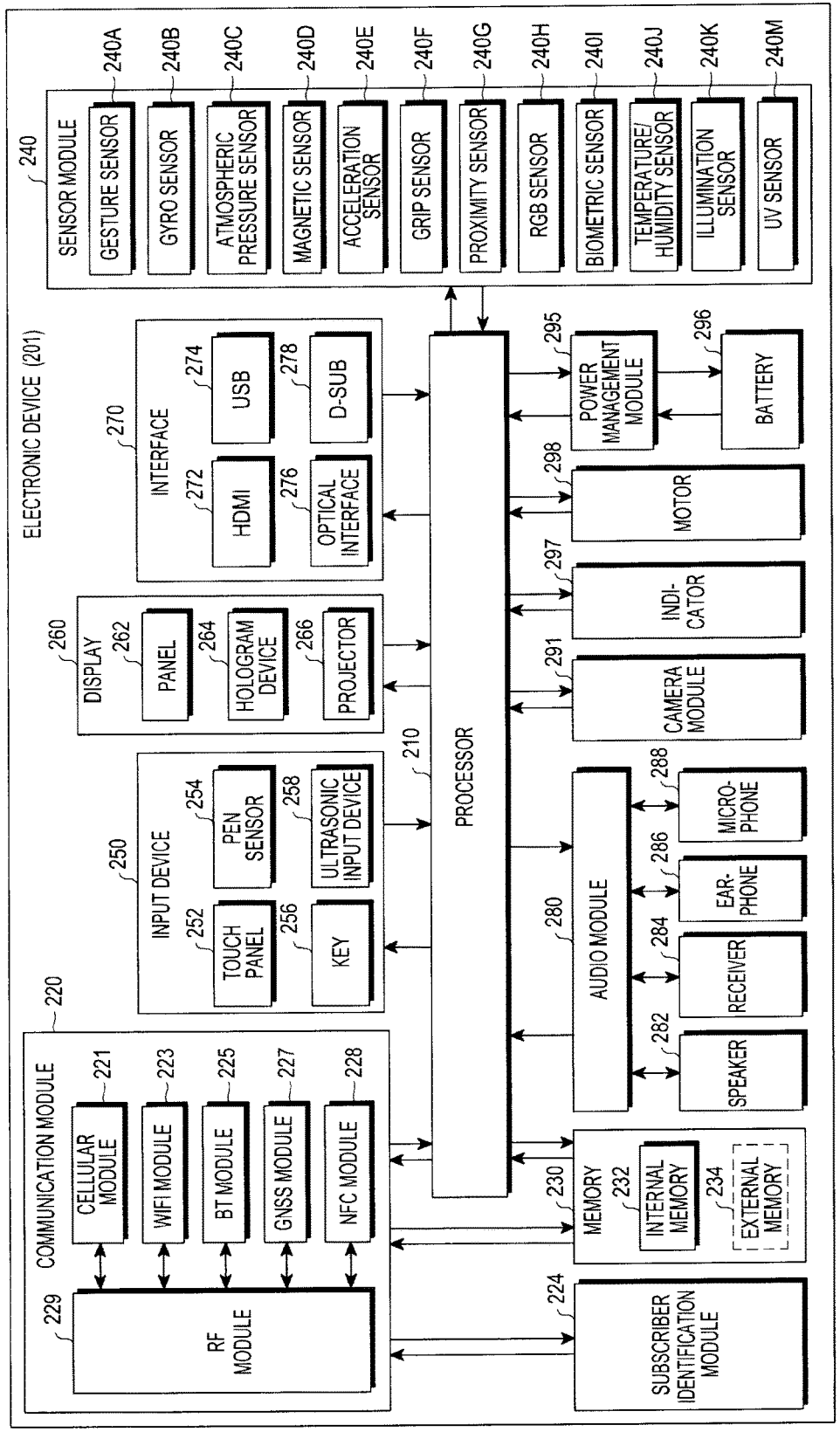
FIG. 2 is a block diagram of an electronic device, according to various embodiments.

FIG. 2 is a block diagram of an electronic device 201, according to various embodiments. The electronic device 201, for example, may include all or some of the elements of the electronic device 101 shown in FIG. 1. The electronic device 201 may include one or more processors {e.g., application processors (AP)} 210, a communication module 220, a memory 230, a sensor module 240, an input device 250, and a display 260. The electronic device 201 may further include at least one of a subscriber identification module 224, an interface 270, an audio module 280, a camera module 291, a power management module 295, a battery 296, an indicator 297, or a motor 298.

The processor 210 may control a multitude of hardware or software elements connected with the processor 210, and may perform the processing of various pieces of data and a calculation by executing an operating system or application programs. The processor 210, for example, may have the same configuration as the processor 120 of FIG. 1. The processor 210 may be implemented by, for example, a system on chip (SoC). According to an embodiment, the processor 210 may further include a graphic processing unit (GPU) and/or an image signal processor. The processor 210 may include at least some (e.g., the cellular module 221) of the elements shown in FIG. 2. The processor 210 may load instructions or data received from one or more other elements (e.g., a non-volatile memory) to a volatile memory to then process the same, and may store a variety of data in a non-volatile memory.

The communication module 220 may have the same or a similar configuration as the communication interface 170 of FIG. 1. The communication module 220, for example, may include at least one of a cellular module 221, a WiFi module 223, a Bluetooth module 225, a GNSS module 227 (e.g., a GPS module, a Glonass module, the Beidou module, or the Galileo module), an NFC module 228, or a radio frequency (RF) module 229.

The cellular module 221, for example, may provide services of voice calls, video calls, text messaging, or the Internet through communication networks. According to an embodiment, the cellular module 221 may perform identification and verification of the electronic device 201 in communication networks by using the subscriber identification module (e.g., a SIM card) 224. According to an embodiment, the cellular module 221 may perform at least some of the functions provided by the processor 210. According to an embodiment, the cellular module 221 may include a communication processor (CP).

For example, each of the WiFi module 223, the Bluetooth module 225, the GNSS module 227, or the NFC module 228 may include a processor for processing data transmitted and received through the corresponding module. According to an embodiment, at least some (e.g., two or more) of the cellular module 221, the WiFi module 223, the Bluetooth module 225, the GNSS module 227, or the NFC module 228 may be included in one integrated chip (IC) or one IC package.

The RF module 229 may transmit and receive data (for example, RF signals). The RF module 229 may include, for example, a transceiver, a power amp module (PAM), a frequency filter, a low noise amplifier (LNA), antennas, or the like. According to another embodiment, at least one of the cellular module 221, the WiFi module 223, the Bluetooth module 225, the GNSS module 227 and the NFC module 228 may transmit and receive RF signals through a separated module.

The subscriber identification module 224 may include a card that adopts a subscriber identification module and/or an embedded SIM, and may include inherent identification information {e.g., an integrated circuit card identifier (IC-CID)} or subscriber information {e.g., an international mobile subscriber identity (IMSI)}.

The memory 230 (e.g., the memory 130) may include an internal memory 232 or an external memory 234. The internal memory 232, for example, may include at least one of volatile memories {e.g., a dynamic RAM (DRAM), a static RAM (SRAM), a synchronous dynamic RAM (SDRAM), or the like} or non-volatile Memories {e.g., an one time programmable ROM (OTPROM), a programmable ROM (PROM), an erasable and programmable ROM (EPROM), an electrically erasable and programmable ROM (EEPROM), a mask ROM, a flash ROM, a flash memory (e.g., NAND flash or NOR flash), a hard drive, a solid state drive (SSD), or the like}.

The external memory 234 may further include a flash drive, for example, compact flash (CF), secure digital (SD), micro secure digital (Micro-SD), mini secure digital (Mini-SD), extreme digital (xD), a memory stick, or the like. The external memory 234 may be functionally and/or physically connected with the electronic device 201 through various interfaces.

The sensor module 240, for example, may measure physical quantities or may detect the operation state of the electronic device 201 to thereby convert the measured or detected information to electric signals. The sensor module 240 may include at least one of, for example, a gesture sensor 240A, a gyro-sensor 240B, an atmospheric sensor 240C, a magnetic sensor 240D, an acceleration sensor 240E, a grip sensor 240F, a proximity sensor 240G a color sensor 240H {e.g., a red-green-blue (RGB) sensor}, a biometric sensor 240I, a temperature/humidity sensor 240J, an illuminance sensor 240K, or an ultra violet (UV) sensor 240M. Alternatively or additionally, the sensor module 240, for example, may further include an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling one or more sensors included therein. In some embodiments, the electronic device 201 may further include a processor, as a part of the processor 210 or separately from the processor 210, which is configured to control the sensor module 240 in order to thereby control sensor module 240 while the processor 210 is in a sleep mode.

The input device 250, for example, may include a touch panel 252, and may further include at least one of a (digital) pen sensor 254, keys 256, or an ultrasonic input device 258. The touch panel 252 may use at least one of, for example, a capacitive type, a pressure type, an infrared type, or an ultrasonic type. In addition, the touch panel 252 may further include a control circuit. The touch panel 252 may further include a tactile layer in order to thereby provide a user with a tactile reaction.

For example, the (digital) pen sensor 254 may be a part of the touch panel, or may include a separate recognition sheet. The keys 256 may include, for example, physical buttons, optical keys, or a keypad. The ultrasonic input device 258 detects ultrasonic waves generated in input means through a microphone (e.g., a microphone 288) to thereby identify data corresponding to the ultrasonic waves.

The display 260 (e.g., the display 160) may include a panel 262, and may further include a hologram device 264 and/or a projector 266. The panel 262 may include the same or similar elements as the display 260 or the display unit 330. The display 260 may have the same, or a different configuration, as the display 160 of FIG. 1. The panel 262 may be implemented to be, for example, flexible, transparent, or wearable. The panel 262 may be configured with the touch panel 252 as a single module. The hologram device 264 may display 3D images in the air by using interference of light. The projector 266 may display images by projecting light onto a screen. The screen may be positioned, for example, inside or outside the electronic device 201. According to an embodiment, the display 260 may further include a control circuit for controlling the panel 262, the hologram device 264, or the projector 266.

The interface 270 may include, for example, at least one of a high-definition multimedia interface (HDMI) 272, a universal serial bus (UBS) 274, an optical interface 276, or a D-subminiature (D-sub) 278. The interface 270 may be included in, for example, the communication interface 170 shown in FIG. 1. Additionally or alternatively, the interface 270 may include, for example, a mobile high-definition link (MHL) interface, a secure digital (SD) card/multi-media card (MMC) interface, or an infrared data association (IrDA) standard interface.

The audio module 280 may convert a sound into an electric signal, and vice versa. At least some elements of the audio module 280 may be included, for example, in the input/output interface 150 shown in FIG. 1. For example, the audio module 280 may process voice information input or output through a speaker 282, a receiver 284, earphones 286, or a microphone 288.

The camera module 291 is a device for photographing still and moving images, and, according to an embodiment, the camera module 291 may include one or more image sensors (e.g., a front sensor or a rear sensor), lenses, an image signal processor (ISP), or a flash (e.g., an LED or a xenon lamp).

The power management module 295 may manage the power of the electronic device 201. According to an embodiment, the power management module 295 may include a power management integrated circuit (PMIC), a charger integrated circuit (IC), or a battery or fuel gauge. The PMIC may be implemented by a wired charging type and a wireless charging type. The wireless charging type may encompass, for example, a magnetic resonance type, a magnetic induction type, or an electromagnetic wave type, and additional circuits for wireless charging, such as coil loops, resonance circuits, or rectifiers, may be provided. The battery gauge may measure, for example, the remaining power of the battery 296, a charging voltage, current, or temperature. The battery 296 may include, for example, a rechargeable battery or a solar battery.

The indicator 297 may display a specific state (for example, a booting state, a message state, or a charging state) of the whole or a part (e.g., the processor 210) of the electronic device 201. The motor 298 may convert an electric signal to a mechanical vibration, and may provide a vibration or a haptic effect. Although it is not shown in the drawing, the electronic device 201 may include a processing device (e.g., a GPU) for supporting mobile TV. The processing device for supporting mobile TV may process media data according to standards, such as, for example, digital multimedia broadcasting (DMB), digital video broadcasting (DVB), or media Flow™.

Each of the above-described component elements of hardware according to the present disclosure may be configured with one or more components, and the names of the corresponding component elements may vary based on the type of electronic device. The electronic device according to various embodiments of the present disclosure may include at least one of the aforementioned elements. Some elements may be omitted or other additional elements may be further included in the electronic device. Also, some of the hardware components according to various embodiments may be combined into one entity, which may perform functions identical to those of the relevant components before the combination.

Figure 3:
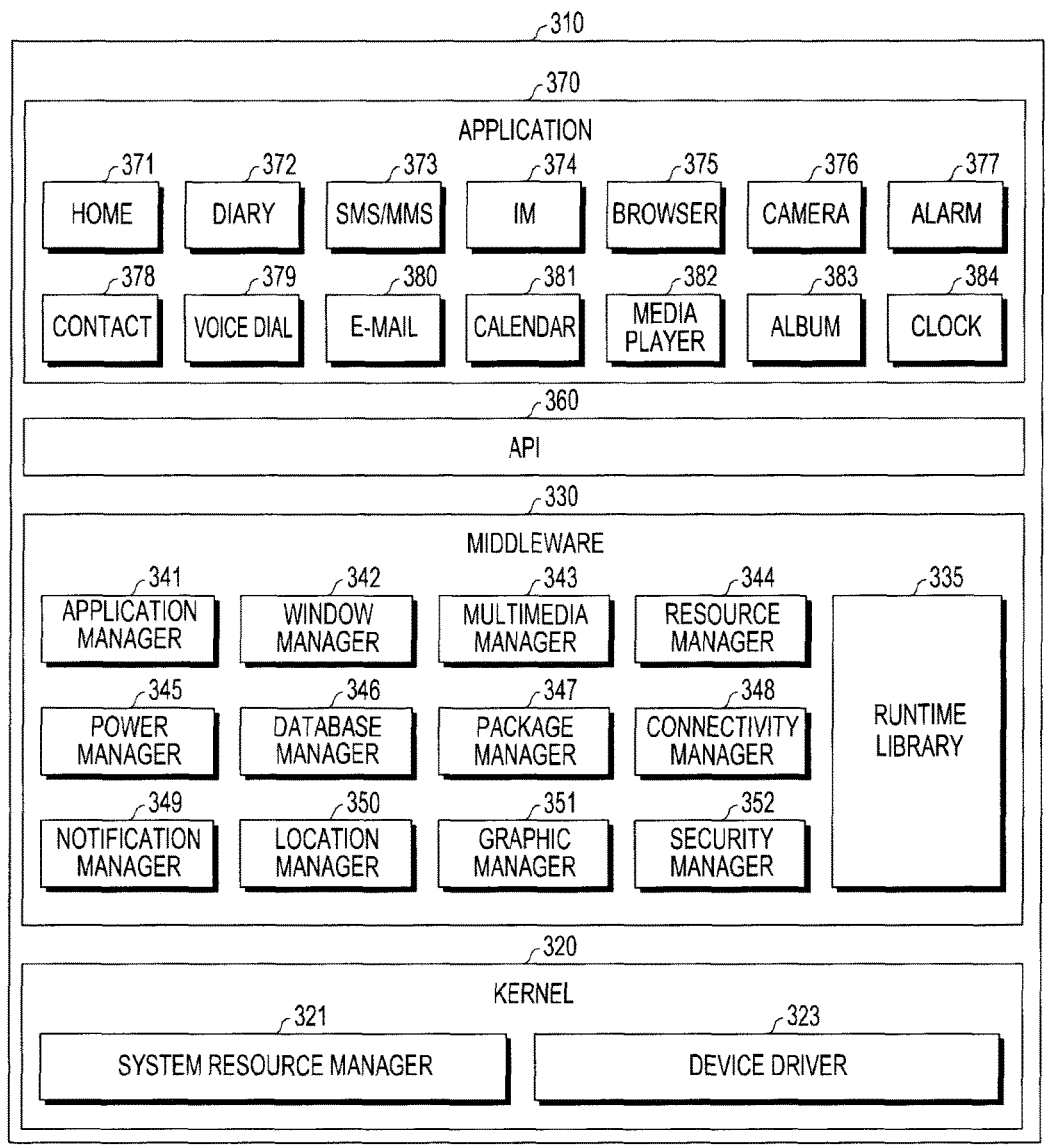
FIG. 3 is a block diagram of a program circuit, according to various embodiments.

FIG. 3 is a block diagram of a program circuit, according to various embodiments. According to an embodiment, the program circuit 310 (e.g., the programs 140) may include an operating system (OS) for controlling resources related to the electronic device (e.g., the electronic device 101) and/or various applications (e.g., the application programs 247), which are operated under the operating system. For example, the operating system may be Android, iOS, Windows, Symbian, Tizen, Bada, or the like.

The program circuit 310 may include a kernel 320, middleware 330, an application programming interface (API) 360, and/or applications 370. At least some of the program circuit 310 may be preloaded in the electronic device, or may be downloaded from external electronic devices (e.g., the electronic devices 102 and 104, or the server 106).

The kernel 320 (e.g., the kernel 141), for example, may include a system resource manager 321 or a device driver 323. The system resource manager 321 may include, for example, a process management unit, a memory management unit, or a file system management unit. The device driver 323 may include, for example, a display driver, a camera driver, a Bluetooth driver, a common memory driver, a USB driver, a keypad driver, a Wi-Fi driver, an audio driver, or an inter-process communication (IPC) driver.

The middleware 330, for example, may provide functions required in common for the applications 370, or may provide various functions through the API 360 in order to allow the applications 370 to effectively use limited system resources in the electronic device. According to an embodiment, the middleware 330 (e.g., the middleware 143) may include at least one of a run time library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

The run time library 335, for example, may include a library module that a compiler uses in order to add new functions through programming languages while the applications 370 are executed. The run time library 335 may perform the input/output management, the memory management, or a function of an arithmetic calculation.

The application manager 341, for example, may manage a life cycle of at least one of the applications 370. The window manager 342 may manage a GUI resource used in the screen. The multimedia manager 343 may identify formats for reproducing various media files, and may perform encoding or decoding of media files by using a codec corresponding to each format. The resource manager 344 may manage resources, such as source codes, memories, or storage spaces of one or more applications 370.

The power manager 345, for example, may manage a battery or power by operating in association with a basic input/output system (BIOS), and may provide power information that is necessary for the operation of the electronic device. The database manager 346 may manage to create, retrieve, or change a database that is to be used in one or more applications 370. The package manager 347 may manage the installation or updating of the applications that are distributed in the form of a package file.

The connectivity manager 348, for example, may manage a wireless connection, such as Wi-Fi or Bluetooth. The notification manager 349 may display or notify of events (such as received messages, appointments, or proximity notifications) to the user without disturbance. The location manager 350 may manage location information of the electronic device. The graphic manager 351 may manage graphic effects to be provided to the user or user interfaces related thereto. The security manager 352 may provide a general security function required for the system security or user authentication. According to an embodiment, in the case of the electronic device (e.g., the electronic device 101) adopting a phone call function, the middleware 330 may further include a telephony manager for managing the functions of a voice call or a video call of the electronic device.

The middleware 330 may include a middleware module through a combination of various functions of the above-described elements. The middleware 330 may provide a module that is specialized according to the type of operating system in order to provide differentiated functions. In addition, the middleware 330 may dynamically exclude some of the typical elements or add new elements.

The API 360 (e.g., the API 145), for example, may be a group of API programming functions, and may be provided with a different configuration according to an operating system. For example, one set of APIs may be provided to each platform in the case of Android or iOS, and two or more sets of APIs may be provided to each platform in the case of Tizen.

The applications 370 (e.g., the applications 147) may include one or more applications that execute functions of home 371, a dialer 372, SMS/MMS 373, instant messages 374, a browser 375, a camera 376, an alarm 377, contacts 378, voice dial 379, e-mail 380, a calendar 381, a media player 382, an album 383, a clock 384, healthcare (e.g., measuring the amount of exercise or blood glucose), providing environment information (e.g., providing atmospheric pressure, humidity, or temperature information), or the like.

According to an embodiment, the applications 370 may include an application (hereinafter, referred to as "information-exchange application" for the convenience of explanation) that supports the exchange of information between the electronic device (e.g., the electronic device 101) and the external electronic device (e.g., the electronic device 102 or 104). The information-exchange application, for example, may include a notification relay application for relaying specific information to the external electronic devices, or a device management application for managing the external electronic devices.

For example, the notification relay application may include a function of transferring notification information generated in other applications (e.g., the SMS/MMS application, the e-mail application, the healthcare application, or the environment information application) of the electronic device to the external electronic device (e.g., the electronic device 102 or 104). In addition, the notification relay application, for example, may receive notification information from the external electronic device to then provide the same to the user.

The device management application, for example, may manage (e.g., install, delete, or update): one or more functions {e.g., turning on and off the external electronic device (or some elements) or adjusting the brightness (or resolution) of a display} of the external electronic device (e.g., the electronic device 102 or 104) that communicates with the electronic device; applications executed in the external electronic device; or services (e.g., a phone call service or a messaging service) provided by the external electronic device.

According to an embodiment, the applications 370 may include applications that are designated according to the attribute (e.g., the healthcare application of a mobile medical device) of the external electronic device (e.g., the electronic device 102 or 104). According to an embodiment, the applications 370 may include applications that are received from the external electronic device (e.g., the server 206 or the electronic device 102 or 104). According to an embodiment, the applications 370 may include preloaded applications or third party applications that can be downloaded from a server. Names of the elements of the program module 310, according to the above-described embodiments of the present disclosure, may change depending on the type of OS.

According to various exemplary embodiments of the present disclosure, at least some of the program circuit 310 may be implemented in software, firmware, hardware, or a combination of two or more thereof. At least some of the program circuit 310 may be implemented (e.g., executed) by, for example, the processor (e.g., the processor 210). At least some of the program circuit 310 may include, for example, a module, a program, a routine, a set of instructions, and/or a process for performing one or more functions.

Figure 4:
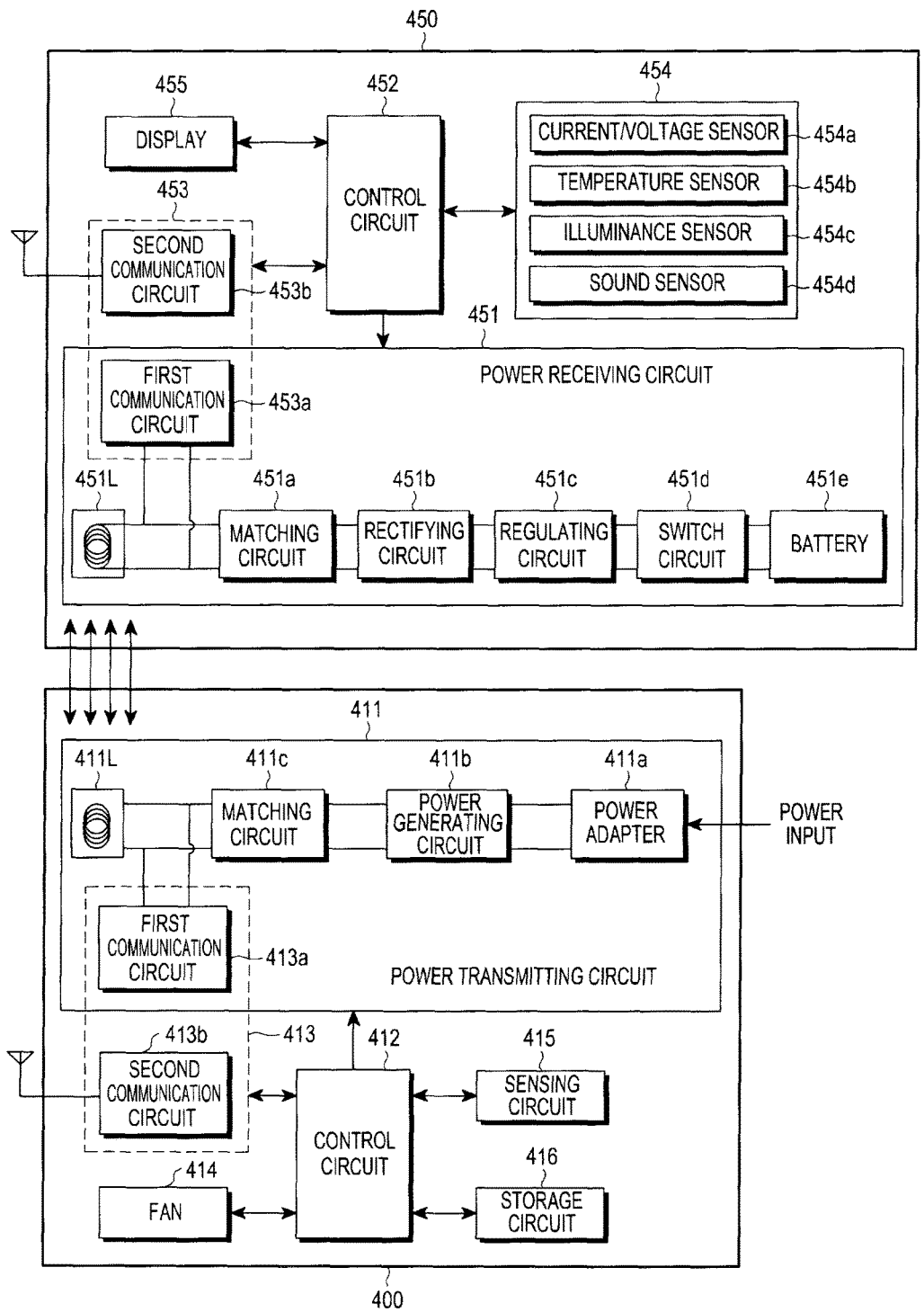
FIG. 4 is a block diagram of a wireless charging system, according to an embodiment of the present disclosure.

FIG. 4 is a block diagram of a wireless charging system, according to an embodiment of the present disclosure. The system include an electronic device 400 for transmitting wireless power and an external electronic device 450 for receiving the transmitted wireless power. Herein, electronic device 400 may be interchangeably called a wireless charging device or a wireless power transmitter, and external device 450 may be called a receiving device. The electronic device 400 may include all, or some, of the elements of the electronic device 101 of FIG. 1 and the electronic device 201 of FIG. 2. The external electronic device 450 may include all, or some, of the elements of external electronic device 102 or 104 shown in FIG. 1. (As noted earlier, external devices 102 and 104 may also include all or some of the elements of device 101 or 201).

The electronic device 400 may include a power transmitting circuit 411, a control circuit 412, a communication circuit 413, a fan 414, a sensing circuit 415, and a storage circuit 416. The external electronic device 450 may include a power receiving circuit 451, a control circuit 452, a communication circuit 453, a sensing circuit 454, and a display 455.

The power transmitting circuit 411 may provide power required by the external electronic device 450 (typically to charge battery 451*e*), which is intended to receive the power, and may include a loop coil 411L that is formed of a conductive pattern. The power transmitting circuit 411 may be configured to wirelessly transmit power to the external electronic device 450 through the loop coil 411L (e.g., with magnetic coupling of energy). Here, the power transmitting circuit 411 may be supplied with power in the form of a direct current or alternating current (AC) from the outside, and may supply the supplied power to the external electronic device 450 in the form of an alternating current. For example, when power is supplied in the form of a direct current (DC) from the outside, the power transmitting circuit 411 may convert the DC power into AC power by using an inverter in order to thereby supply the power to the external electronic device 450 in the form of an alternating current. The power transmitting circuit 411 is not limited thereto, and it may include any suitable means that can provide a constant AC power.

In addition, the power transmitting circuit 411 may provide an alternating current to the external electronic device 450 in the form of an electromagnetic wave. The power transmitting circuit 411 may transmit or receive a specific electromagnetic wave, which is generated by applying a current to the loop coil 411L, by using an electromagnetic induction method or a resonance method. The power transmitting circuit 411 may further include the first communication circuit 413*a* (e.g., a resonant circuit), and may perform an in-band type of communication (e.g., data communication) by using the electromagnetic wave generated by the loop coil 411L. The first communication circuit 413*a* will be described in more detail in the description of the communication circuit 413 later.

In addition, the power transmitting circuit 411 may be implemented in the form of a built-in battery, and/or may be implemented in the form of a power receiving interface to receive power from the outside and to supply the same to other elements.

The power transmitting circuit 411 as described above, for example, may further include a power adapter 411*a*, a power generating circuit 411*b*, and a matching circuit 411*c*, as well as the loop coil 411L.

The power adapter 411*a* may receive AC power or DC power from the outside, or may receive a power signal of a battery device in order to thereby output a direct current of a predetermined voltage value. The voltage value of the DC power output from the power adapter 411*a* may be controlled by the controller (control circuit) 412. The DC power output from the power adapter 411*a* may be output to the power generating circuit 411*b*.

The power generating circuit 411*b* may convert a direct current output from the power adapter 411*a* into an alternating current to be outputted. The power generating circuit 411*b* may include a predetermined amplifier (not shown), and if a direct current input through the power adapter 411*a* is less than a predetermined gain, the power generating circuit 411*b* may amplify the direct current to the predetermined gain by using the amplifier. In addition, the power generating circuit 411*b* may further include a circuit that converts a direct current, which is input from the power adapter 411*a*, into an alternating current based on a control signal received from the control circuit 412. For example, the power generating circuit 411*b* may convert the direct current into an alternating current through a predetermined inverter. Alternatively, the power generating circuit 411*b* may further include a gate driving device (not shown), and the gate drive device may control turning on/off the direct current in order to thereby convert the same into an alternating current. Alternatively, the power generating circuit 411*b* may create an alternating current signal through a wireless power generator (e.g., an oscillator). Accordingly, the power generation signal 411*b* may output the AC power.

The matching circuit 411*c* may perform impedance matching. For example, when an alternating current signal output from the power generating circuit 411*b* is transferred to the loop coil 411L, an electromagnetic field may be formed in loop coil 411L by the alternating current signal. At this time, the frequency band of the electromagnetic signal formed may be adjusted by adjusting the impedance of the matching circuit 411*c*. The matching circuit 411*c* may thereby enable the output of a high-efficient or high power, which is transmitted to the external electronic device 450 through the loop coil 411L, through the adjustment of the impedance. The matching circuit 411*c* may adjust the impedance on the basis of the control of the control circuit 412. The matching circuit 411*c* may include at least one of an inductor (e.g., a coil), a capacitor, or a switch device. The control circuit 412 may control the connection state with at least one of the inductor or the capacitor through the switch device, and thus may perform impedance matching.

The power transmitting circuit 411 is not limited thereto, and it is easy for those skilled in the art to understand that any means that can transmit and receive electromagnetic waves can be adopted as the power transmitting circuit 411.

The fan 414 may discharge the heat generated in the electronic device to the outside. For example, the fan 414 may be positioned adjacent to the loop coil 411L. The electronic device 400 may emit heat when generating power in the power transmitting circuit 411 or when transmitting power to the external electronic device 450. The fan 414 may be driven to discharge the heat to the outside in order to thereby prevent the temperature rise of the electronic device 400 caused by the heating. Here, the driving speed of the fan 414 may be controlled by the control circuit 412. For example, the control circuit 412 may adjust the driving speed of the fan 414 based on at least some of the information that is received from the external electronic device 450 through the communication circuits 413a and 413b. Alternatively, the control circuit 412 may adjust the driving speed of the fan 414 to correspond to the amount of power, which is generated in the power transmitting circuit 411 or transmitted, or the temperature due to the heating according thereto. The method for controlling the driving speed of the fan 414 will be described later in more detail.

The sensing circuit 415 (e.g., the sensor module 240) may sense a change in the current/voltage applied to the loop coil 411L of the power transmitting circuit 411. The electronic device 400 may determine the amount of power to be transmitted to the external electronic device 450 to correspond to the intensity of the current/voltage applied to the loop coil 411L. That is, the electronic device 400 may regulate the amount of the power to be transmitted according to a change in the current/voltage applied to the loop coil 411L. For example, as the intensity of the current/voltage applied to the loop coil 411L increases, the amount of power transmitted may increase, and as the intensity of the current/voltage applied to the loop coil 411L decreases, the amount of power transmitted may decrease. Furthermore, the sensing circuit 415 may sense a temperature change of the electronic device 400. The sensing circuit 415 may sense a change in temperature caused by the heat that may be generated in the electronic device 400 when generating the power to be transmitted by the power transmitting circuit 411 or when transmitting the power to the external electronic device 450. For example, the sensing circuit 415 may measure at least one of an internal temperature or an external temperature of the electronic device 400. According to an embodiment, the sensing circuit 415 may include at least one of a current/voltage sensor or a temperature sensor.

The control circuit 412 (e.g., the processor 120 of the electronic device 101 or the processor 210 of the electronic device 201) may control the overall operations of the electronic device 400. The control circuit 412 may control the overall operations of the electronic device 400 by using algorithms, programs, or applications that are stored in the storage circuit 416 (e.g., the memory 130) and which may be required for the control. The control circuit 412 may be implemented in the form of a CPU, a microprocessor, or a minicomputer.

The control circuit 412 may control the following operations: 1) wirelessly transmitting power to the external electronic device 450 through the power transmitting circuit 411; 2) wirelessly receiving information from the external electronic device 450 through the communication circuit 413; and 3) adjusting the driving speed of the fan 414 based at least in part on the received information.

According to an embodiment, the received information may include at least one piece of: charging configuration information that is related to the battery state of the external electronic device 450; power control information that is related to the adjustment of the amount of power transmitted to the external electronic device 450; environment information that is related to a charging environment of the external electronic device 450; or time information of the external electronic device 450.

The charging configuration information may relate to the battery state of the external electronic device 450 at the wireless charging time between the electronic device 400 and the external electronic device 450. For example, the charging configuration information may include at least one of the total capacity of battery, battery percentage, the number of times a battery is charged, the amount of battery usage, a charging mode, a charging method, or a wireless reception frequency band in the external electronic device 450.

The power control information may be intended to control the initial amount of power that has been transmitted according to a change in the charged amount of power of the external electronic device 450 during the wireless charging between the electronic device 400 and the external electronic device 450. For example, the power control information may include at least one of: the first requested amount of power to control the initial amount of transmitted power according to a change in the charged amount of power of the battery 451e of the external electronic device 450; the second requested amount of power to control the initial amount of transmitted power according to a conversion of a charging method of the external electronic device 450 {e.g., a conversion from a constant current (CC) charging method into a constant voltage (CV) charging method}; or the third requested amount of power to control the initial amount of transmitted power according to a change in the charging mode of the external electronic device 450 (e.g., a high-speed charging mode or a low-speed charging mode). In addition, the power control information may include instructions for controlling the power transmitting circuit 411 of the electronic device 400 based on at least one of the first to third requested amount of power.

The environment information may be obtained by measuring the charging environment of the external electronic device 450 by the sensing circuit 454 of the external electronic device 450, and, for example, may include at least one piece of: temperature data that includes at least one of the internal temperature or the external temperature of the external electronic device 450; illuminance data that represents the surrounding illuminance (brightness) of the external electronic device 450; or sound data that represents surrounding sounds (noise) of the external electronic device 450. The sound data may include at least one of a fan noise level caused by the driving of the fan 414 of the electronic device 400 during the wireless charging or an external noise level that is distinct from the fan noise level.

The time information may include time data that is measured by the external electronic device 450 based on predetermined time data (e.g., a specific period of time, such as bedtime). The predetermined time data may be configured by a user or by a system (e.g., a server).

According to an embodiment, the control circuit 412 may control generating or transmitting power to be transmitted to the external electronic device 450 based on the charging configuration information among the received information. In addition, the control circuit 412 may adjust the driving speed of the fan 414 depending on the amount of power transmitted based on the charging configuration information among the received information. For example, the control circuit 412 may adjust the driving speed of the fan 414 to a predetermined driving speed to correspond to the amount of transmitted power.

According to an embodiment, the control circuit 412 may determine or change the amount of power transmitted to the external electronic device 450 based on at least some of the received information (e.g., at least one piece of the power control information, the environment information, or the time information). The control circuit 412 may transmit the changed power to the external electronic device 450. In addition, the control circuit 412 may readjust the driving speed of the fan 414 based on at least some of the received information.

The detailed operation of the control circuit 412 will be described later with reference to FIGS. 5 to 11.

The communication circuit 413 (the first communication circuit 413a and the second communication circuit 413b) (e.g., the communication interface 170 or the communication module 220) may communicate with the external electronic device 450 in a predetermined manner. The communication circuit 413 may perform data communication with the communication circuit 453 of the external electronic device 450.

For example, the communication circuit 413 may receive signals for the information of the external electronic device 450 (e.g., at least one piece of the power control information, the environment information, or the time information). In addition, the communication circuit 413 may transmit signals for the information of the electronic device 400 to the external electronic device 450. Here, the communication circuit 413 may unicast, multicast, or broadcast the signals. In addition, the communication circuit 413 may transmit and receive a charging function control signal for controlling the charging function of the external electronic device 450. The charging function control signal may control the power receiving circuit 451 of a specific external electronic device (e.g., the external electronic device 450) to enable or disable the charging function.

Meanwhile, the communication circuit 413 may transmit/receive signals to/from other wireless power transmission devices (not shown), as well as the external electronic device 450.

For example, the communication circuit 413, according to the embodiment of the present disclosure, may include at least one of the first communication circuit 413a by which the electronic device 400 may perform the in-band type of communication by being implemented with the power transmitting circuit 411 as one piece of hardware or the second communication circuit 413b by which the electronic device 400 may perform the out-of-band type of communication by being implemented to be different hardware from the power transmitting circuit 411.

For example, if the communication circuit 413 includes the first communication circuit 413a in which the in-band type of communication can be performed, the first communication circuit 413a may receive the frequency and signal level of an electromagnetic signal that is received through the loop coil 411L of the power transmitting circuit 411. At this time, the control circuit 412 may decode the received frequency and signal level of the electromagnetic signal in order to thereby extract information that is received from the external electronic device 450. In addition, the first communication circuit 413a may apply a signal for information on the electronic device 400, which is to be transmitted to the external electronic device 450, to the loop coil 411L of the power transmitting circuit 411, or may include a signal for information on the electronic device 400 in an electromagnetic signal, which is generated by applying a signal output from the matching circuit 411c to the loop coil 411L, to then be transmitted to the external electronic device 450. At this time, the control circuit 412 may control changing the connection state with at least one of the inductor or the capacitor of the matching circuit 411c to then be output through the on/off control of the switch device included in the matching circuit 411c.

For example, if the communication circuit 413 includes the second communication circuit 413b in which the out-of-band type of communication may be performed, the second communication circuit 413b may communicate with the communication circuit 453 (e.g., the second communication circuit 453b) of the external electronic device 450 by using NFC (near field communication), Zigbee communication, infrared communication, visible light communication, Bluetooth communication, BLE (low energy Bluetooth) communication, or the like.

Meanwhile, the communication schemes of the communication circuit 413 described above are only examples, and the scope of the present disclosure is not limited to a specific communication scheme performed by the communication circuit 413.

The electronic device 400 and the external electronic device 450 may transmit and receive various signals through the respective communication circuits 413 and 453.

Meanwhile, the power receiving circuit 451 of the external electronic device 450, according to the embodiment of the present disclosure, may receive power from the power transmitting circuit 411 of the electronic device 400. The power receiving circuit 451 may be implemented in the form of a built-in battery, or may be implemented in the form of a power receiving interface to receive power from the outside. The power receiving circuit 451 may include a loop coil 451L that is formed of a conductive pattern. The power receiving circuit 451 may receive, through the loop coil 451L, wireless power in the form of an electromagnetic wave, which is generated in response to a current/voltage applied to the loop coil 411L of the power transmitting circuit 411. For example, the power receiving circuit 451 may receive, from the power transmitting circuit 411, the power that is supplied to the loop coil 451L of the adjacent power receiving circuit 451 through an induced electromotive force generated by the AC power applied to the loop coil 411L of the power transmitting circuit 411.

The power receiving circuit 451, for example, may be configured to further include a matching circuit 451a, a rectifying circuit 451b, a regulating circuit (regulator) 451c, a switch circuit 451d, and a battery 451e, as well as the loop coil 451L.

The matching circuit 451a may perform impedance matching. For example, the power transmitted through the loop coil 411L of the electronic device 400 may be transferred to the loop coil 451L to generate an electromagnetic field. At this time, the matching circuit 451a may adjust the impedance in order to thereby adjust the frequency band of the generated electromagnetic signal. The matching circuit 451a may enable the reception of a high-efficient and high power input from the electronic device 400 through the loop coil 451L by the adjustment of the impedance above. The matching circuit 451a may adjust the impedance based on the control of the control circuit 452. The matching circuit 451a may include at least one of an inductor (e.g., a coil), a capacitor, or a switch device. The control circuit 452 may control the connection state with at least one of the inductor or the capacitor through the switch device, and thus may perform impedance matching.

The rectifying circuit 451b may rectify wireless power received in the loop coil 451L into DC power, and, for example, may be implemented in the form of a bridge diode.

The regulating circuit 451c may convert the rectified power into a predetermined gain. The regulating circuit 451c may include a predetermined DC/DC converter (not shown). For example, the regulating circuit 451c may convert the rectified power such that the voltage of an output end is 5V. Meanwhile, the minimum value and the maximum value of a voltage that is applied to the front end of the regulating circuit 451c may be predetermined.

The switch circuit 451d may connect the regulating circuit 451c to the battery 451e. The switch circuit 451d may switch between the on state and the off state according to the control of the control circuit 452.

The battery 451e may be charged by power that is supplied from the regulating circuit 451c when the switch circuit 451d is in the on state.

The sensing circuit 454 may sense a change in the state of power received in the external electronic device 450. For example, the sensing circuit 454 may periodically, or aperiodically, measure a value of a current/voltage that is received in the loop coil 451L through a predetermined current/voltage sensor 454a. The external electronic device 450 may calculate the amount of power that is received in the external electronic device 450 based on the measured current/voltage.

In addition, the sensing circuit 454 may sense a change in the charging environment of the external electronic device 450. For example, the sensing circuit 454 may periodically, or aperiodically, measure at least one of an internal temperature or an external temperature of the external electronic device 450 through a predetermined temperature sensor 454b. The sensing circuit 454 may periodically, or aperiodically, measure the surrounding illuminance (brightness) of the external electronic device 450 through a predetermined illuminance sensor 454c. The sensing circuit 454 may periodically, or aperiodically, measure the surrounding sound (noise) level of the external electronic device 450 through a predetermined sound sensor 454d. For example, the sound level, which is measured through the sound sensor 454d, may be due to at least one of fan noise that may be generated by the driving of the fan 414 of the electronic device 400 or external noise that is distinct from the fan noise. The sound sensor 454d may include a predetermined speaker (not shown).

The display 455 may display overall information that is related to the charging state of the external electronic device 450. For example, the display 455 may display at least one of the total capacity of battery, battery percentage, the amount of battery charging, the amount of battery usage, or a charging estimation time in the external electronic device 450.

The communication circuit 453 may communicate with the electronic device 400 in a predetermined manner. The communication circuit 453 may perform data communication with the communication circuit 413 of the electronic device 400. For example, the communication circuit 453 may transmit signals representing the information of the external electronic device 450 (e.g., at least one piece of the charging configuration information, the power control information, the environment information, or the time information). In addition, the communication circuit 453 may receive signals representing certain information of the electronic device 400. For example, the communication circuit 453 may receive, from the electronic device 400, a charging function control signal for controlling a charging function of the external electronic device 450. The charging function control signal may control the power receiving circuit 451 of a specific external electronic device (e.g., the external electronic device 450) to enable or disable the charging function. Here, the communication circuit 453 may unicast, multicast, or broadcast the signals.

Meanwhile, the communication circuit 453 may transmit/receive signals to/from other wireless power transmission devices (not shown), as well as the electronic device 400.

As described in connection with the communication circuit 413 of the electronic device 400 above, the communication circuit 453, according to an embodiment of the present disclosure, may include at least one of the first communication circuit 453a by which the external electronic device 450 may perform in-band type of communication by being implemented with the power receiving circuit 451 as one piece of hardware, or the second communication circuit 453b by which the external electronic device 450 may perform out-of-band type of communication by being implemented to be different hardware from the power receiving circuit 451. The communication circuit 453 may be configured the same or as the communication circuit 413 of the electronic device 413 while the functions are reversely performed, thus a detailed description thereof is omitted for brevity.

The control circuit 452 may transmit, to the electronic device 400, the charging configuration information for receiving the required amount of power through the communication circuit 453 based on information that is related to the battery state of the external electronic device 450. For example, when the control circuit 452 recognizes the electronic device 400 to which wireless power can be transmitted, the control circuit 452 may create the charging configuration information for receiving the required amount of power based on at least one of the total capacity of battery, battery percentage, the number of times a battery is charged, the amount of battery usage, a charging mode, a charging method, or wireless reception frequency band in the external electronic device 450. The control circuit 452 may transmit the created charging configuration information to the electronic device 400 through the communication circuit 453.

The control circuit 452 may transmit, to the electronic device 400, the power control information for controlling the amount of power that is received from the electronic device 400 depending on a change in the charged amount of power in the external electronic device 450 (e.g., the battery 451e) through the communication circuit 453. For example, if a current/voltage value that is measured by the current/voltage sensor 454a exceeds a predetermined current/voltage threshold value, the control circuit 452 may determine that the charged amount of power of the battery 451e of the external electronic device 450 has been changed, and may create the power control information that includes at least one of: the requested amount of power for receiving the required amount of power to correspond to the changed amount of power; or an instruction for controlling the power transmitting circuit 411 of the electronic device 400 based on the requested amount of power. The control circuit 452 may transmit the created power control information to the electronic device 400 through the communication circuit 453. Herein, the amount of power transmitted by the wireless charging device 400 may be interchangeably referred to as the "transmit power" or the "transmit power level".

The control circuit 452 may transmit, to the electronic device 400, the environment information according to a charging environment change of the external electronic device 450. For example, the control circuit 452 may create the environment information based on a result of comparing at least one piece of temperature data, illumination data, or sound data, which is measured by the sensing circuit 454 (e.g., at least one of the temperature sensor 454*b*, the illuminance sensor 454*c*, or the sound sensor 454*c*), with respective threshold values. For example, if the temperature data value measured by the temperature sensor 454*b* is equal to, or more than, a predetermined temperature threshold value, the control circuit 452 may create environment information including the measured temperature data. In addition, if the illuminance data value measured by the illuminance sensor 454*c* is equal to, or less than, a predetermined illuminance threshold value, the control circuit 452 may create environment information including the measured illuminance data. If a fan noise level and an exterior noise level, which is distinct from the fan noise level among the sound data measured by the sound sensor 454*d*, are equal to, or more than, a predetermined sound threshold value, the control circuit 452 may create environment information including the measured noise levels. In addition, the control circuit 452 may create environment information that includes at least one piece of the temperature data, the illumination data, or the sound data, which is periodically, or aperiodically, measured, instead of comparing the measured environment information with the corresponding threshold value. In this case, the comparison process may be performed in the electronic device 400. The control circuit 452 may transmit the created environment information to the electronic device 400 through the communication circuit 453.

The control circuit 452 may transmit, to the electronic device 400, time information according to a time change of the external electronic device 450 based on predetermined time data (e.g., a specific period of time, such as bedtime). For example, the control circuit 452 may periodically or aperiodically measure time data through a predetermined timer or a time measurement circuit. The control circuit 452 may create time information including the measured time data based on the comparison result of the measured time data and the predetermined time data. For example, if the measured time data corresponds to the predetermined time data, the control circuit 452 may create time information including the measured time data. In addition, the control circuit 452 may create time information that includes the time data, which is periodically, or aperiodically, measured, instead of comparing the measured time data with the predetermined time data. In this case, the comparison process may be performed in the electronic device 400. The control circuit 452 may transmit the created time information to the electronic device 400 through the communication circuit 453.

The detailed operation of the control circuit 452 will be described later with reference to FIG. 12.

Although the electronic device 400 and the external electronic device 450, according to the embodiment of the present disclosure, include only the power transmitting circuit 411 and the power receiving circuit 451, respectively, in FIG. 4, each of the electronic device 400 and the external electronic device 450 may include both the power transmitting circuit 411 and the power receiving circuit 451. According to this, the electronic device 400 and the external electronic device 450, according to the embodiment of the present disclosure, may perform the functions of both of a power transmitter and a power receiver.

According to various embodiments, an electronic device may include: a coil disposed in the electronic device; a first circuit (e.g., power transmitting circuit 411) configured to wirelessly transmit power to an external electronic device through the coil; a second circuit (e.g. 413) configured to wirelessly receive information from the external electronic device; a fan disposed adjacent to the coil to discharge heat to the outside of the electronic device; and a control circuit configured to adjust the driving speed of the fan based at least in part on at least some of the received information.

According to various embodiments, the control circuit may be configured to change the transmitted amount of power based on at least some of the received information.

According to various embodiments, the control circuit may be configured to change the driving speed of the fan based on the changed amount of power.

According to various embodiments, the second circuit may be configured to wirelessly receive the information through the coil.

According to various embodiments, the device may further include a wireless communication circuit, wherein the second circuit is configured to wirelessly receive the information through the wireless communication circuit.

According to various embodiments, the information may include at least one piece of: charging configuration information that is related to the battery state of the external electronic device; power control information that is related to the adjustment of the transmitted amount of power; environment information that is related to a charging environment of the external electronic device; or time information of the external electronic device.

According to various embodiments, the charging configuration information may include at least one of the total capacity of battery, battery percentage, the number of times a battery is charged, the amount of battery usage, a charging mode, a charging method, or a wireless reception frequency band in the external electronic device.

According to various embodiments, the power control information may include at least one of: the requested amount of power according to a change in the charged amount of power of the battery of the external electronic device; the requested amount of power according to a conversion of a charging mode of the external electronic device; or the requested amount of power according to a conversion of a charging method of the external electronic device.

According to various embodiments, the control circuit may readjust the adjusted driving speed of the fan based on a result of comparing the requested amount of power, which has been received, with the transmitted amount of power.

According to various embodiments, if the requested amount of power, which has been received, is equal to, or less than, the transmitted amount of power, the control circuit may reduce the transmitted amount of power and may reduce the adjusted driving speed of the fan according to the changed amount of power, and if the requested amount of power, which has been received, exceeds the transmitted amount of power, the control circuit may increase the transmitted amount of power and may increase the adjusted driving speed of the fan according to the changed amount of power.

According to various embodiments, the environment information may include at least one piece of temperature data, illuminance data, or sound data, which is measured by the external electronic device.

According to various embodiments, if the received temperature data value is equal to, or more than, a predetermined temperature data value, the control circuit may reduce the transmitted amount of power and may reduce the adjusted driving speed of the fan according to the changed amount of power.

According to various embodiments, if the received illuminance data value is equal to, or less than, a predetermined illuminance data value, the control circuit may reduce the transmitted amount of power and may reduce the adjusted driving speed of the fan according to the changed amount of power.

According to various embodiments, if the received sound level data value is equal to, or more than, a predetermined sound level data value, the control circuit may reduce the transmitted amount of power and may reduce the adjusted driving speed of the fan according to the changed amount of power.

According to various embodiments, if time data of the received time information corresponds to a predetermined period of time, the control circuit may reduce the transmitted amount of power and may reduce the adjusted driving speed of the fan according to the changed amount of power.

According to various embodiments, an electronic device may include: a coil; a battery; a first circuit (e.g., circuit 451) configured to wirelessly receive power through the coil and is electrically connected to the battery; a second circuit (e.g. communication circuit 453) configured to wirelessly transmit information to an external electronic device (wireless charging device); a processor (e.g. 120 or 210 or a processor of control circuit 452) electrically connected to the first circuit and the second circuit; and a memory (e.g. 130 or 230) electrically connected to the processor, wherein the memory stores instructions that, when being executed, cause the processor to transmit, to the wireless charging device via the second circuit, information related to a battery state of the electronic device or an external environment of the electronic device, or time information, when the wireless charging device is positioned adjacent to the coil. According to various embodiments, the wireless charging device may further include a control circuit that is configured to change the driving speed of a fan based on at least some of the received information.

Figure 5:
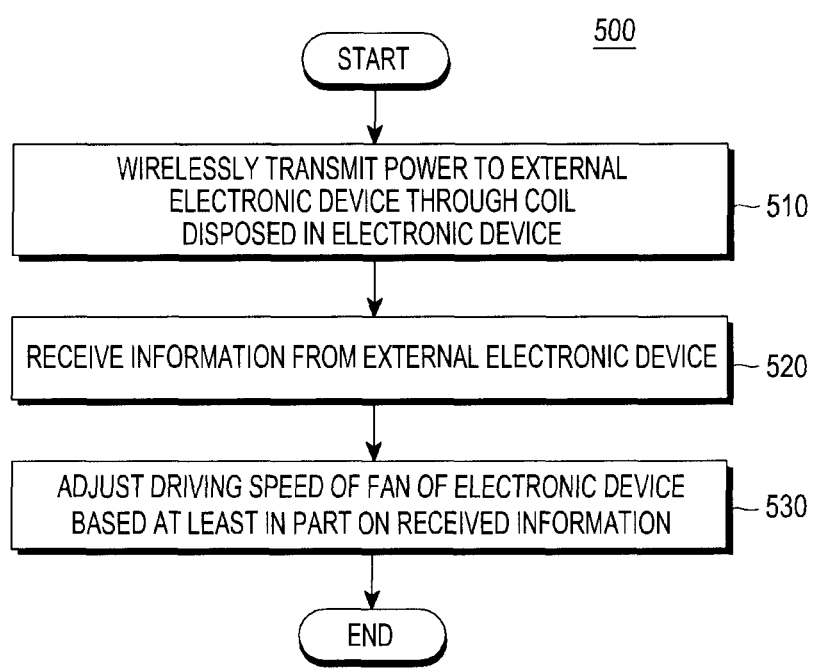
FIG. 5 is a flowchart showing a fan control method of an electronic device, according to an embodiment of the present disclosure.

FIG. 5 is a flowchart showing a fan control method 500 of an electronic device, according to an embodiment of the present disclosure. The fan control method may include operations 510 to 530 and may be performed by at least one of: an electronic device (e.g., the wireless charging device 400); a processor (e.g., the processor 120 or the processor 210) of the electronic device; or a controller (e.g., the controller 412) of the electronic device.

In operation 510, for example, the wireless charging device may wirelessly transmit power to the external electronic device 450 (e.g., a wireless power receiver) through the loop coil 411L disposed in the electronic device.

In operation 520, for example, the electronic device may receive information from the external electronic device 450.

According to an embodiment, the received information may include at least one piece of: charging configuration information that is related to the battery state of the external electronic device 450; power control information that is related to the adjustment of the amount of power transmitted to the external electronic device 450; environment information that is related to a charging environment of the external electronic device 450; or time information of the external electronic device 450.

The charging configuration information may relate to the initial battery state of the external electronic device 450 at the wireless charging start time between the electronic device 400 and the external electronic device 450. For example, the charging configuration information may include at least one of the total capacity of battery, battery percentage, the number of times a battery is charged, the amount of battery usage, a charging mode, a charging method, or a wireless reception frequency band in the external electronic device 450.

The power control information may be intended to control the transmitted amount of power according to a change in the charged amount of power of the external electronic device 450 during the wireless charging between the electronic device 400 and the external electronic device 450. For example, the power control information may include at least one of: the first requested amount of power to control the transmitted amount of power according to a change in the charged amount of power of the battery 451e of the external electronic device 450; the second requested amount of power to control the transmitted amount of power according to a conversion of a charging method of the external electronic device 450 {e.g., a conversion from a constant current (CC) charging method into a constant voltage (CV) charging method}; or the third requested amount of power to control the transmitted amount of power according to a change in the charging mode of the external electronic device 450 (e.g., a high-speed charging mode or a low-speed charging mode). In addition, the power control information may include instructions for controlling the power transmitting circuit 411 of the electronic device 400 based on at least one of the first requested amount of power to the third requested amount of power.

The environment information may be obtained by measuring the charging environment of the external electronic device 450 by the sensing circuit 454 of the external electronic device 450, and, for example, may include at least one of: temperature data that includes at least one of the internal temperature or the external temperature of the external electronic device 450; illuminance data that represents the surrounding illuminance (brightness) of the external electronic device 450; or sound data that represents surrounding sounds (noise) of the external electronic device 450. The sound data may include at least one of: a fan noise level due to the driving of the fan 414 of the electronic device 400 during the wireless charging; or an external noise level that is distinct from the fan noise level.

The time information may include time data that is measured by the external electronic device 450 based on predetermined time data (e.g., a specific period of time, such as bedtime). The predetermined time data may be configured by a user.

In operation 530, for example, the electronic device may adjust the driving speed of the fan based at least in part on at least some of the information received from the external electronic device 450.

According to an embodiment, the electronic device may generate power to be transmitted to the external electronic device 450, or may transmit the same thereto based on the charging configuration information among the received information. For example, the electronic device may generate power to be transmitted, or may transmit the same based on at least some of the charging configuration information. In addition, the electronic device may adjust the driving speed of the fan 414 depending on the transmitted amount of power based on the charging configuration information among the received information.

According to an embodiment, the electronic device may change the amount of power transmitted (i.e., change the transmit power level) to the external electronic device 450 based at least in part on at least some of the received information (e.g., at least one piece of the power control information, the environment information, or the time information). In addition, the electronic device may readjust the driving speed of the fan 414 based on at least some of the received information.

For example, when the wireless charging device 400 receives the power control information among the received information, it may change the transmit power level based on the requested amount of power that is included in the received power control information. In addition, the wireless charging device 400 may adjust the driving speed of the fan 414 to be a driving speed corresponding to the changed transmit power level (which has been changed according to the received information on the requested amount of power). Alternatively, in some cases the driving speed of the fan may be adjusted based on at least some of the received information, independent of the transmit power level.

For example, when the electronic device receives the environment information among the received information, the electronic device may determine or change the amount of transmission power based on at least some of the received environment information (e.g., at least one piece of temperature data, illuminance data, or sound data). The electronic device may adjust the driving speed of the fan based on the amount of transmission power. In addition, the device 400 may readjust the driving speed of the fan 414 to a driving speed corresponding to at least one of the received environment information.

For example, when device 400 receives the time information among the received information, device 400 may change the transmitted amount of power based on the received time information. For example, if the received time information corresponds to predetermined time data (e.g., a specific period of time, such as bedtime), device 400 may readjust the driving speed of the fan 414 to a driving speed corresponding to the received time information.

Figure 6:
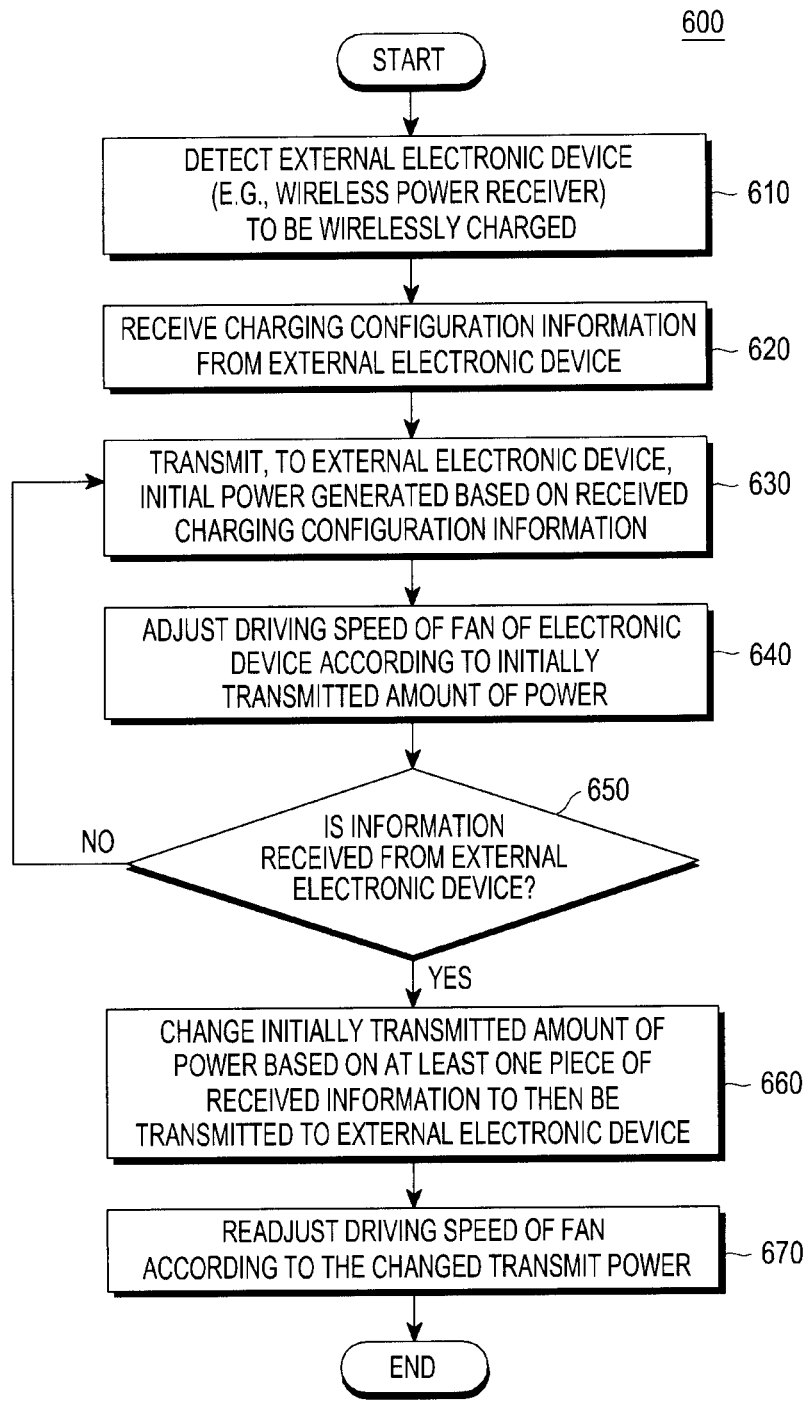
FIG. 6 is a detailed flowchart showing a fan control method of an electronic device, according to an embodiment of the present disclosure.

FIG. 6 is a flowchart showing a fan control method 600 of an electronic device, according to an embodiment of the present disclosure. The fan control method may include operations 610 to 670 and may be performed by at least one of: an electronic device (e.g., the electronic device 400); a processor (e.g., the processor 120 or the processor 210) of the electronic device; or a controller (e.g., the control circuit 412) of the electronic device.

In operation 610, for example, the electronic device may detect one or more external electronic devices (e.g., external electronic device 450) that can be wirelessly charged by receiving wireless power.

According to an embodiment, the electronic device operating as a wireless charging device may generate and broadcast detection signals to detect one or more external electronic devices 450. When one or more external electronic devices 450 approach, the wireless charging device may receive a feedback signal in response to the broadcast detection signal from the one or more external electronic devices 450. The wireless charging device may determine whether or not the one or more external electronic devices 450 exist according to whether or not the feedback signal is received. If it is determined that one or more external electronic devices 450 exist, the wireless charging device may detect the one or more external electronic devices 450 that are verified through a predetermined verification process for the wireless power transmission.

In operation 620, for example, the electronic device may receive, from the one or more detected external electronic devices 450, charging configuration information that is related to the battery state of the external electronic devices 450.

In operation 630, for example, the electronic device may transmit, to the external electronic device 450, the amount of transmission power that is generated based on the received charging configuration information.

According to an embodiment, the electronic device may transmit, to each external electronic device 450, the amount of transmission power that is generated based on each piece of the charging configuration information received from the one or more external electronic devices. (In some cases, more than one external electronic device 450 may be simultaneously charged by wireless charging device 400.)

In operation 640, for example, the electronic device may adjust the driving speed of the fan 414 based on the received charging configuration information.

According to an embodiment, the electronic device may emit heat when generating the amount of power required for the electronic device based on the received charging configuration information or when transmitting power to the external electronic device 450, and may adjust the driving speed of the fan 414 that is driven to discharge the heat to the outside. For example, as the amount of power required for the electronic device increases in response to the received charging configuration information, the heat temperature of the electronic device 400 may increase. At this time, the electronic device may drive the fan 414 to emit the generated heat to the outside. The electronic device may configure the driving speed of the fan 414 depending on the amount of power required for the electronic device 400 to correspond to the received charging configuration information in order to thereby adjust the driving speed of the fan 414.

In operation 650, for example, the electronic device may determine whether or not predetermined information is received from the external electronic device 450. If the information is received, the electronic device may perform operation 660, and if the information is not received, the electronic device may repeat operation 630.

According to an embodiment, the electronic device may periodically, or aperiodically, monitor whether or not predetermined information is received from the external electronic device 450, or may make a request to the external electronic device 450 for information.

According to an embodiment, the received information may include at least one piece of: power control information that is related to the adjustment of the amount of power transmitted to the external electronic device 450; environment information that is related to a charging environment of the external electronic device 450; or time information of the external electronic device 450. The detailed description of the power control information, the environment information, and the time information may be replaced by the description of operation 520 in FIG. 5.

According to an embodiment, the electronic device may receive the power control information from the external electronic device 450 when the requested amount of power is changed according to at least one of: a change in the charged amount of power of the external electronic device 450; a conversion of a charging method of the external electronic device 450; or a change in the charging mode of the external electronic device 450 according to a user input (or configuration). A fan control method of the electronic device upon the receipt of the power control information will be described in more detail with reference to FIG. 7.

According to one embodiment, the electronic device may receive the environment information from the external electronic device 450 in a predetermined time cycle. For example, the external electronic device 450 may measure the environment information of the external electronic device 450 through the sensing circuit 454 in a predetermined time cycle, and may transmit the same to the electronic device so that the electronic device may receive the environment information from the external electronic device 450. In the present embodiment, a fan control method of the electronic device upon the receipt of the environment information will be described in more detail below with reference to FIGS. 8 to 11.

According to an embodiment, the electronic device may receive the environment information from the external electronic device 450 when the external electronic device 450 detects a change in the environment information (e.g., when a criterion for changing the charging state is satisfied). For example, the external electronic device 450 may transmit, to the electronic device, the environment information that is created based on a result of comparing the environment information, which is measured in a predetermined time cycle, with each corresponding predetermined threshold value of the environment information so that the electronic device may receive the environment information from the external electronic device 450. In this case, the electronic device may omit the operation of comparing the received environment information with each corresponding predetermined threshold value of the environment information. The electronic device may change the initially transmitted amount of power to the amount of power corresponding to the received environment information, and may readjust the driving speed of the fan 414 to correspond to the received environment information.

In operation 660, for example, the electronic device may change the initially transmitted amount of power (so that power is output at a different transmit power level) based on at least some of the received information to then be transmitted to the external electronic device 450.

According to an embodiment, the electronic device may change the initially transmitted amount of power to the different transmit power level by using the requested amount of power of the power control information among the received information.

For example, when the requested amount of power for reducing the initially transmitted amount of power is received because the external electronic device 450 stops the power transmission according to the full charging of the battery, the charging method of the external electronic device 450 switches from the constant current (CC) charging into the constant voltage (CV) charging, or because the charging mode of the external electronic device 450 is converted into the low-speed charging mode by a user's input or configuration, the electronic device may reduce the initially transmitted amount of power to correspond to the received request amount of power. The electronic device 400 may transmit the reduced power to the external electronic device 450. In addition, for example, if the external electronic device 450 is converted into the high-speed charging mode by a user's input or configuration in order to reduce the charging time of the battery and the requested amount of power for increasing the initially transmitted amount of power is received, the electronic device may increase the initially transmitted amount of power in response to the received request amount of power. The electronic device may transmit the increased power to the external electronic device 450.

According to an embodiment, the electronic device may change and transmit the initially transmitted amount of power in accordance with the environment information among the received information.

For example, in the case where the electronic device receives temperature data of the environment information, if the received temperature data is equal to, or more than, a predetermined temperature threshold value, the electronic device may reduce the initially transmitted amount of power to correspond to the received temperature data. The electronic device may transmit the reduced power to the external electronic device 450. Furthermore, if the received temperature data is less than a predetermined temperature threshold value, the electronic device may maintain the transmitted amount of power via suitable control.

For example, in the case where the electronic device receives illuminance data of the environment information, if the received illuminance data is equal to, or less than, a predetermined illuminance threshold value, the electronic device may reduce the initially transmitted amount of power to correspond to the received illuminance data. The electronic device may transmit the reduced power to the external electronic device 450. In addition, if the received illuminance data exceeds a predetermined illuminance threshold value, the electronic device may increase the initially transmitted amount of power to correspond to the received illuminance data. The electronic device may transmit the reduced or increased power to the external electronic device 450.

For example, in the case where the electronic device receives sound data (e.g., the fan noise level) of the environment information, if the received sound data is equal to, or more than, a predetermined sound threshold value, the electronic device may reduce the initially transmitted amount of power to correspond to the received sound data. The electronic device may transmit the reduced power to the external electronic device 450.

According to an embodiment, the electronic device may change and transmit the initially transmitted amount of power by using time information of the received information.

For example, if time data of the received time information corresponds to predetermined time data (e.g., a specific period of time, such as bedtime), the electronic device may reduce the initially transmitted amount of power to the amount of power corresponding to the received time data.

In operation 670, for example, the electronic device may readjust the driving speed of the fan 414 based at least in part on at least some of the received information.

According to an embodiment, the electronic device may readjust the driving speed of the fan 414 to a driving speed corresponding to the requested amount of power of the power control information among the received information.

For example, if the received requested amount of power is less than the initially transmitted amount of power, the heat emitted from the electronic device may decrease. Accordingly, the electronic device may reduce the driving speed of the fan 414 to the driving speed corresponding to the requested amount of power. In addition, for example, if the received requested amount of power is equal to, or more than, the initially transmitted amount of power, the heat emitted from the electronic device may increase. Accordingly, the electronic device may increase the adjusted driving speed of the fan 414 to a driving speed corresponding to the requested amount of power.

According to an embodiment, the electronic device may readjust the driving speed of the fan 414 to a driving speed corresponding to environment information of the received information.

For example, in the case where the electronic device receives temperature data of the environment information, if the received temperature data is equal to, or more than, a predetermined temperature threshold value, the electronic device may increase the driving speed of the fan 414 to a driving speed corresponding to the received temperature data. In addition, if the received temperature data is less than a predetermined temperature threshold value, the electronic device may maintain the current driving speed of the fan 414 via suitable control.

For example, in the case where the electronic device receives illuminance data of the environment information, if the received illuminance data is equal to, or less than, a predetermined illuminance threshold value, the electronic device may reduce the driving speed of the fan 414 to a driving speed corresponding to the received illuminance data. In addition, if the received illuminance data exceeds a predetermined illuminance threshold value, the electronic device may maintain the current driving speed of the fan 414.

For example, in the case where the electronic device receives sound data (e.g., the fan noise level) of the environment information, if the received sound data is equal to, or more than, a predetermined sound threshold value, the electronic device may reduce the driving speed of the fan 414 to a driving speed corresponding to the received sound data. In addition, if the received sound data is less than a predetermined sound threshold value, the electronic device may maintain the current driving speed of the fan 414 via suitable control.

According to an embodiment, the electronic device may readjust the driving speed of the fan 414 to a driving speed corresponding to time information of the received information.

For example, if time data of the received time information corresponds to predetermined time data (e.g., a specific period of time, such as bedtime), the electronic device may reduce the driving speed of the fan 414 to a driving speed corresponding to the received time data. In addition, if time data of the received time information does not correspond to predetermined time data (e.g., a specific period of time, such as bedtime), the electronic device may maintain the current driving speed of the fan 414.

Figure 7:
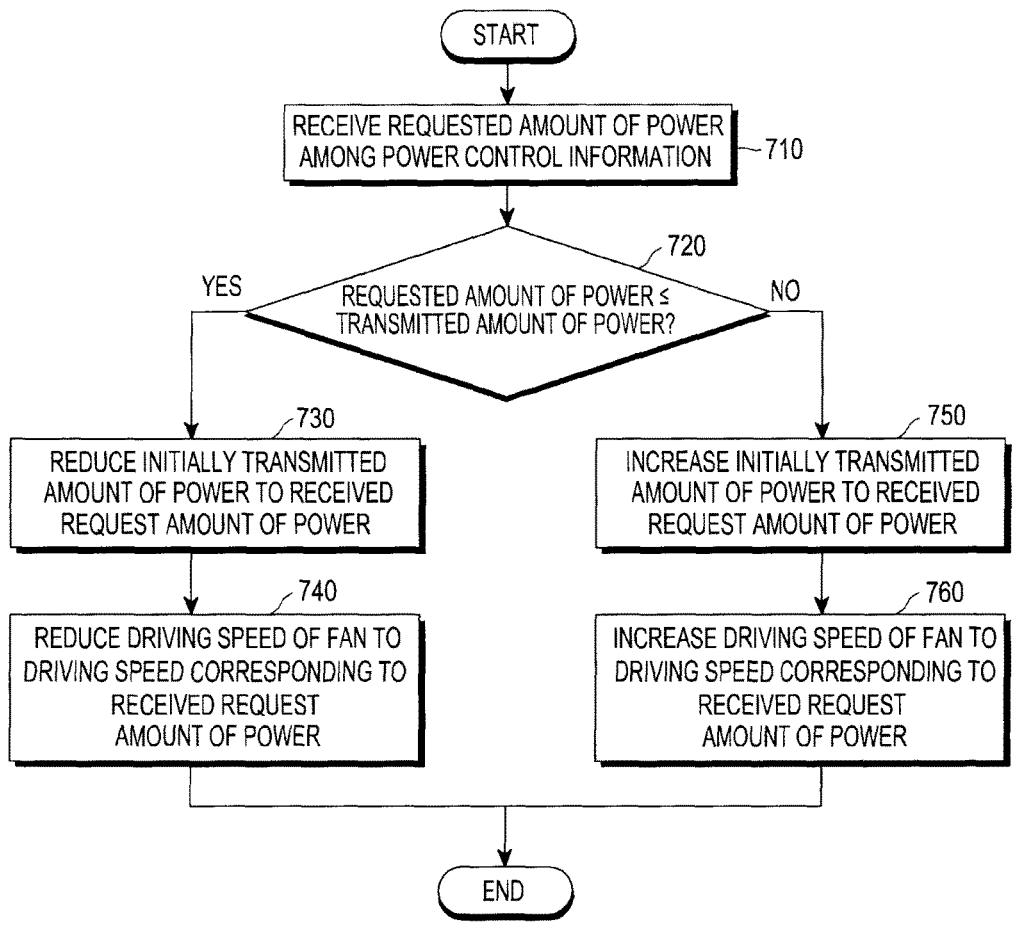
FIG. 7 is a detailed flowchart showing a fan control method of an electronic device, according to an embodiment of the present disclosure.

FIG. 7 is a detailed flowchart showing a fan control method of an electronic device, according to an embodiment of the present disclosure. This flowchart illustrates a fan control method of an electronic device when receiving the requested amount of power of the power control information among the received information in operation 650 of FIG. 6, and the method includes operations 710 to 760. The fan control method of an electronic device may be performed by at least one of: an electronic device (e.g., the electronic device 400); a processor (e.g., the processor 120 or the processor 210) of the electronic device; or a controller (e.g., the controller 412) of the electronic device.

In operation 710, for example, the electronic device may receive, from the external electronic device 450, the requested amount of power of the power control information among the received information in operation 650 of FIG. 6.

In operation 720, for example, the electronic device may determine whether or not the requested amount of power is equal to, or less than, the transmitted amount of power. If the requested amount of power, which has been received, is equal to, or less than, the transmitted amount of power, the electronic device may perform operation 730, whereas if the requested amount of power exceeds the transmitted amount of power, the electronic device may perform operation 750.

According to an embodiment, the requested amount of power, which has been received, may include the requested amount of power for reducing the initially transmitted amount of power when: the external electronic device 450 stops the power transmission according to the full charging of the battery; the charging method switches from the CC charging method into the CV charging method; or the charging mode of the external electronic device 450 is converted into the low-speed charging mode by a user's input or configuration.

According to an embodiment, the requested amount of power may include the requested amount of power to increase the transmitted amount of power that is transmitted upon a conversion into the high-speed charging mode in order to reduce the charging time of the battery 451*e* of the external electronic device 450.

In operation 730, for example, the electronic device may reduce the transmitted amount of power to correspond to the received request amount of power.

In operation 740, for example, the electronic device may reduce the driving speed of the fan 414 to a driving speed corresponding to the received request amount of power.

In operation 750, for example, the electronic device may increase the transmitted amount of power to correspond to the received request amount of power.

In operation 760, for example, the electronic device may increase the driving speed of the fan 414 to a driving speed corresponding to the received request amount of power.

Figure 8:
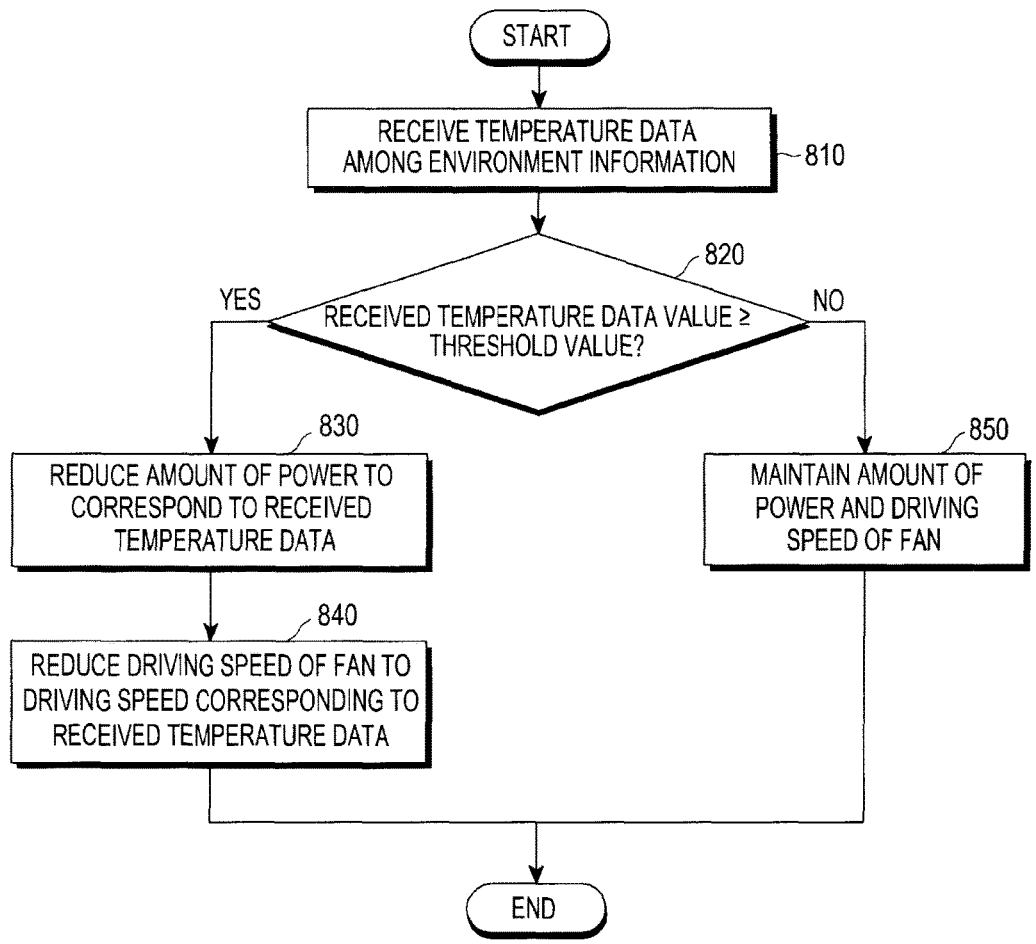
FIG. 8 is a detailed flowchart showing a fan control method of an electronic device, according to an embodiment of the present disclosure.

FIG. 8 is a detailed flowchart showing a fan control method of an electronic device, according to an embodiment of the present disclosure. This flowchart illustrates a fan control method of an electronic device when receiving the temperature data included in the environment information among the received information in operation 650 of FIG. 6, and the method may include operations 810 to 850. The fan control method of an electronic device may be performed by at least one of: an electronic device (e.g., the electronic device 400); a processor (e.g., the processor 120 or the processor 210) of the electronic device; or a controller (e.g., the controller 412) of the electronic device.

In operation 810, for example, the electronic device may receive, from the external electronic device 450, the environment information including the temperature data.

In operation 820, for example, the electronic device may determine whether or not the received temperature data value is equal to, or more than, a predetermined temperature threshold value. If the received temperature data value is equal to, or more than, a predetermined temperature threshold value, the electronic device may perform operation 830, whereas if the received temperature data value is less than a predetermined temperature threshold value, the electronic device may perform operation 850.

In operation 830, for example, the electronic device may reduce the transmitted amount of power to correspond to the received temperature data.

Meanwhile, operation 830 may be omitted. For example, even when the received temperature data value is equal to, or more than, a predetermined temperature threshold value, the electronic device may perform operation 840 instead of performing operation 830. In this case, the amount of power may remain.

In operation 840, the electronic device may increase the driving speed of the fan 414 to a driving speed corresponding to the received temperature data.

According to an embodiment, the heat emitted from the electronic device may decrease due to the fact that the transmitted amount of power is changed to be reduced. Accordingly, the electronic device may reduce the driving speed of the fan 414 in order to thereby minimize noise generated during the wireless charging.

According to an embodiment, the heat emitted from the electronic device may decrease due to the fact that the transmitted amount of power is changed to be reduced. Accordingly, the electronic device may maintain the current driving speed of the fan 414 via suitable control.

In operation 850, the electronic device may maintain the initial amount of power transmitted based on the charging configuration information. According to this, the electronic device may maintain the driving speed of the fan 414 as well.

Figure 9:
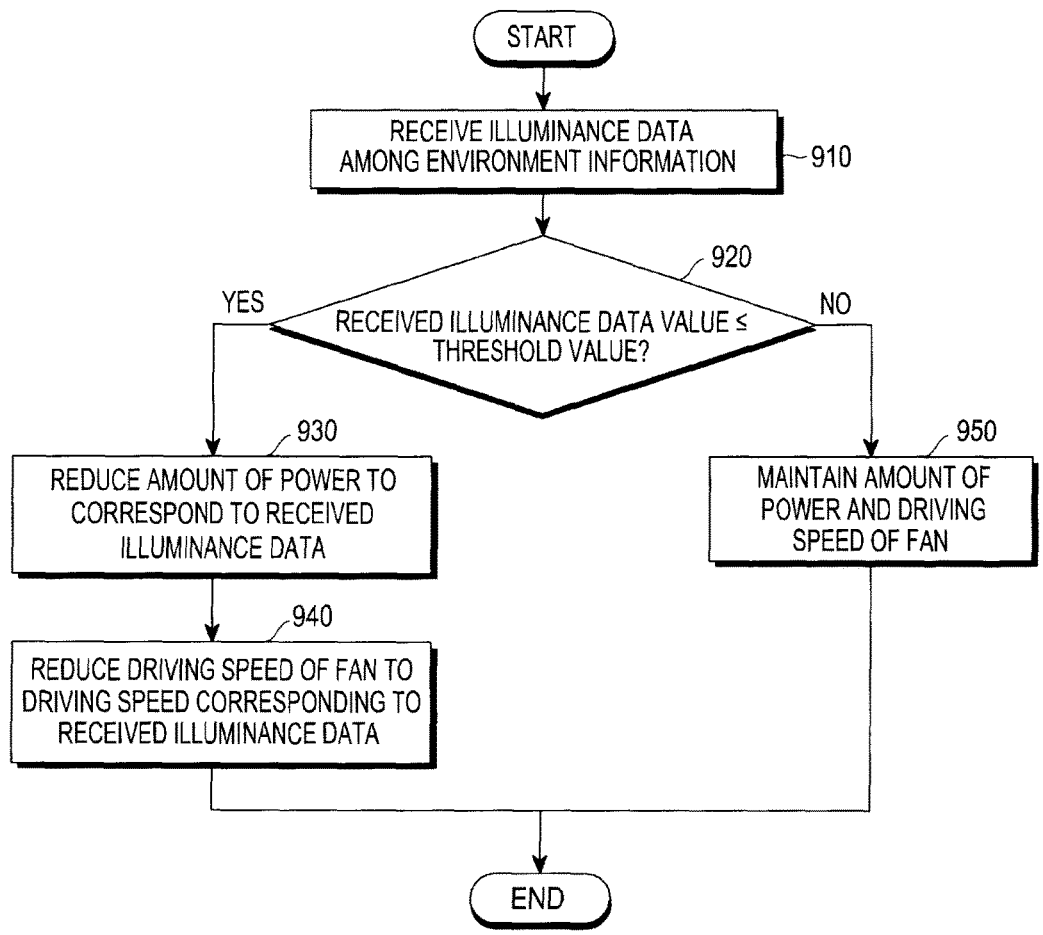
FIG. 9 is a detailed flowchart showing a fan control method of an electronic device, according to an embodiment of the present disclosure.

FIG. 9 is a detailed flowchart showing a fan control method of an electronic device, according to an embodiment of the present disclosure. This flowchart illustrates a fan control method of an electronic device when receiving the environment information including the illuminance data among the received information in operation 650 of FIG. 6, and the method may include operations 910 to 950. The fan control method of an electronic device may be performed by at least one of: an electronic device (e.g., the electronic device 400); a processor (e.g., the processor 120 or the processor 210) of the electronic device; or a controller (e.g., the controller 412) of the electronic device.

In operation 910, for example, the electronic device may receive, from the external electronic device 450, the environment information including the illuminance data.

In operation 920, for example, the electronic device may determine whether or not the received illuminance data value is equal to, or less than, a predetermined illuminance threshold value. If the received illuminance data value is equal to, or less than, a predetermined illuminance threshold value, the electronic device may perform operation 930, whereas if the received illuminance data value exceeds a predetermined illuminance threshold value, the electronic device may perform operation 950.

In operation 930, for example, the electronic device may reduce the initially transmitted amount of power to correspond to the received illuminance data.

Meanwhile, operation 930 may be omitted. For example, even when the received illuminance data value is equal to, or less than, a predetermined illuminance threshold value, the electronic device may perform operation 940 instead of performing operation 930. In this case, the amount of power may remain.

In operation 940, the electronic device may reduce the driving speed of the fan 414 to a driving speed corresponding to the received illuminance data. The heat emitted from the electronic device may decrease due to the fact that the initially transmitted amount of power has been reduced. Accordingly, the electronic device reduce the driving speed of the fan 414 in order to thereby minimize noise generated during the wireless charging.

In operation 950, the electronic device may maintain the initial amount of power transmitted based on the charging configuration information. According to this, the electronic device may maintain the driving speed of the fan 414 as well.

Figure 10:
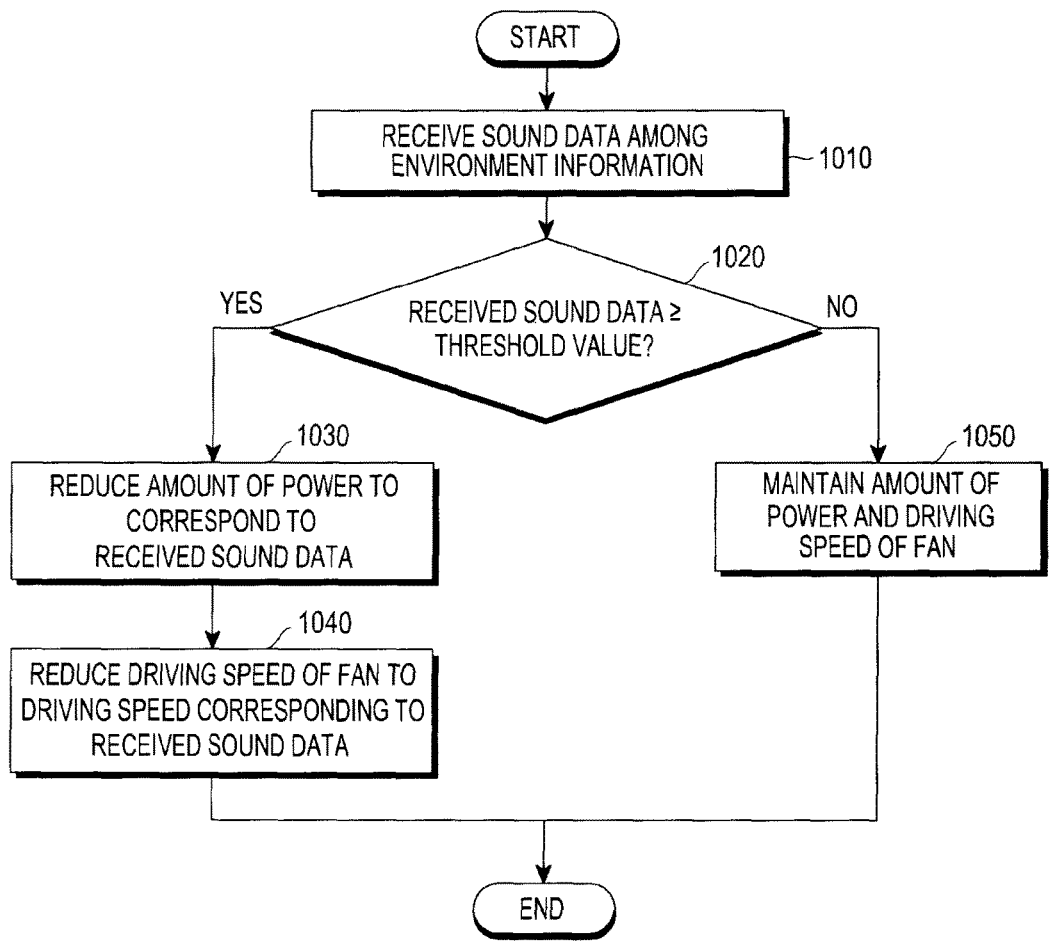
FIG. 10 is a detailed flowchart showing a fan control method of an electronic device, according to an embodiment of the present disclosure.

FIG. 10 is a detailed flowchart showing a fan control method of an electronic device, according to an embodiment of the present disclosure. This flowchart illustrates a fan control method of an electronic device when receiving the environment information including the sound data among the received information in operation 650 of FIG. 6, and the method may include operations 1010 to 1050. The fan control method of an electronic device may be performed by at least one of: an electronic device (e.g., the electronic device 400); a processor (e.g., the processor 120 or the processor 210) of the electronic device; or a controller (e.g., the controller 412) of the electronic device.

In operation 1010, for example, the electronic device may receive, from the external electronic device 450, the environment information including the sound data.

According to an embodiment, the received sound data may include at least one of: a fan noise level that may be generated by the driving of the fan 414 during the wireless charging; or an external noise level that is distinct from the fan noise level.

In operation 1020, for example, the electronic device may determine whether or not the received sound data value (e.g., a fan noise level) is equal to, or more than, a predetermined sound threshold value. If the received sound data value is equal to, or more than, a predetermined sound threshold value, the electronic device may perform operation 1030, whereas if the received sound data value is less than a predetermined sound threshold value, the electronic device may perform operation 1050.

In operation 1030, for example, the electronic device may reduce the initially transmitted amount of power to correspond to the received sound data.

Meanwhile, operation 1030 may be omitted. For example, even when the received sound data value is equal to, or more than, a predetermined sound threshold value, the electronic device may perform operation 1040 instead of performing operation 1030. In this case, the amount of power may remain.

In operation 1040, the electronic device may reduce the driving speed of the fan 414 to a driving speed corresponding to the received sound data. The heat emitted from the electronic device may decrease due to the fact that the initially transmitted amount of power has been reduced. Accordingly, the electronic device may reduce the driving speed of the fan 414 in order to thereby minimize noise generated during the wireless charging.

In operation 1050, the electronic device may maintain the initial amount of power transmitted based on the charging configuration information. According to this, the electronic device may maintain the driving speed of the fan 414 as well.

Figure 11:
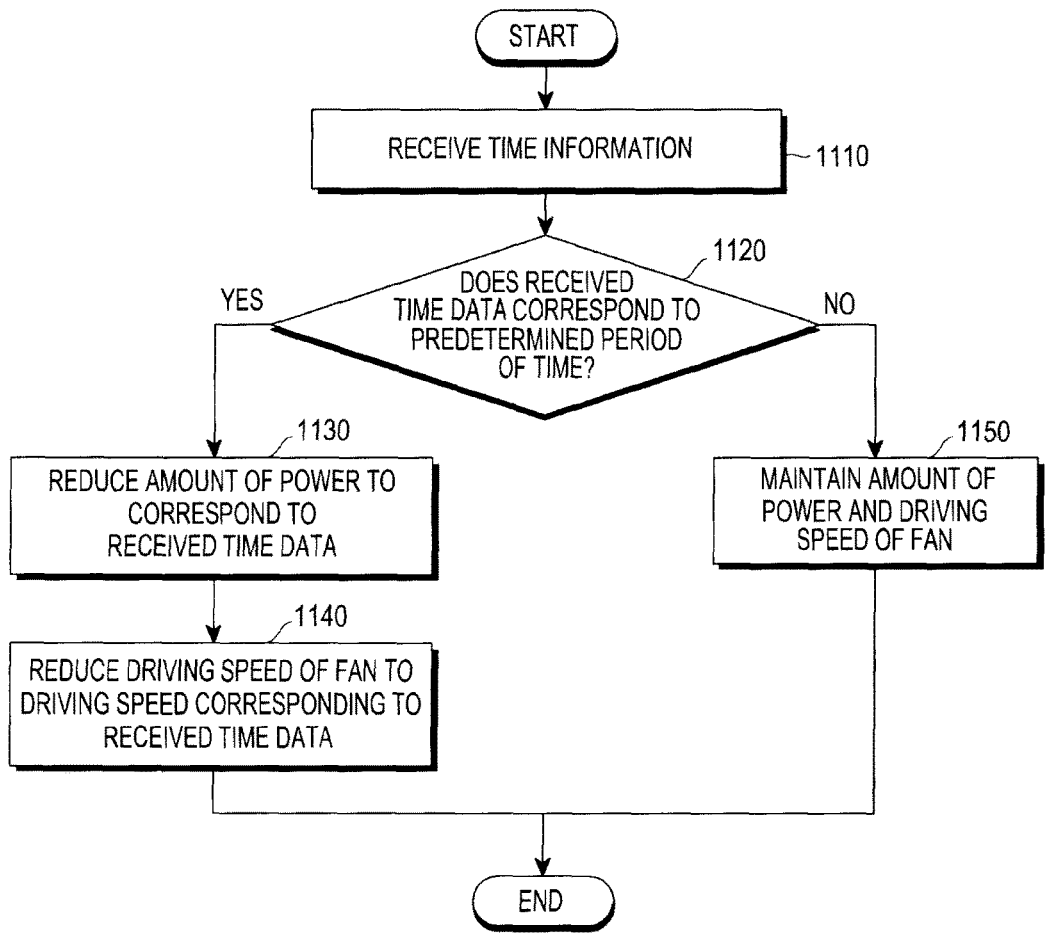
FIG. 11 is a detailed flowchart showing a fan control method of an electronic device, according to an embodiment of the present disclosure.

FIG. 11 is a detailed flowchart showing a fan control method of an electronic device, according to an embodiment of the present disclosure. This flowchart illustrates a fan control method of an electronic device according to the time data among the received information in operation 650 of FIG. 6, and the method may include operations 1110 to 1150. The fan control method of an electronic device may be performed by at least one of: an electronic device (e.g., the electronic device 400); a processor (e.g., the processor 120 or the processor 210) of the electronic device; or a controller (e.g., the controller 412) of the electronic device.

In operation 1110, for example, the electronic device may receive, from the external electronic device 450, the time data/information among the environment information.

In operation 1120, for example, the electronic device may determine whether or not the received time data corresponds to a predetermined period of time. If the received time data corresponds to a predetermined period of time, the electronic device may perform operation 1130, whereas if the received time data does not correspond to a predetermined period of time, the electronic device may perform operation 1150.

According to an embodiment, the predetermined period of time may be input or configured by a user. For example, the predetermined period of time may include bedtime.

In operation 1130, for example, the electronic device may reduce the transmitted amount of power to correspond to the received time data.

Meanwhile, operation 1130 may be omitted. For example, even when the received time data corresponds to a predetermined period of time, the electronic device may perform operation 1140 instead of performing operation 1130. In this case, the amount of power may remain.

In operation 1140, the electronic device may reduce the configured driving speed of the fan 414 to correspond to the changed amount of transmission power. The heat emitted from the electronic device may decrease due to the fact that the transmitted amount of power is changed to be reduced. Accordingly, the electronic device may reduce the driving speed of the fan 414 in order to thereby minimize noise generated during the wireless charging.

In operation 1150, the electronic device may maintain the amount of power generated based on the charging configuration information. According to this, the electronic device may maintain the driving speed of the fan 414 as well.

Figure 12:
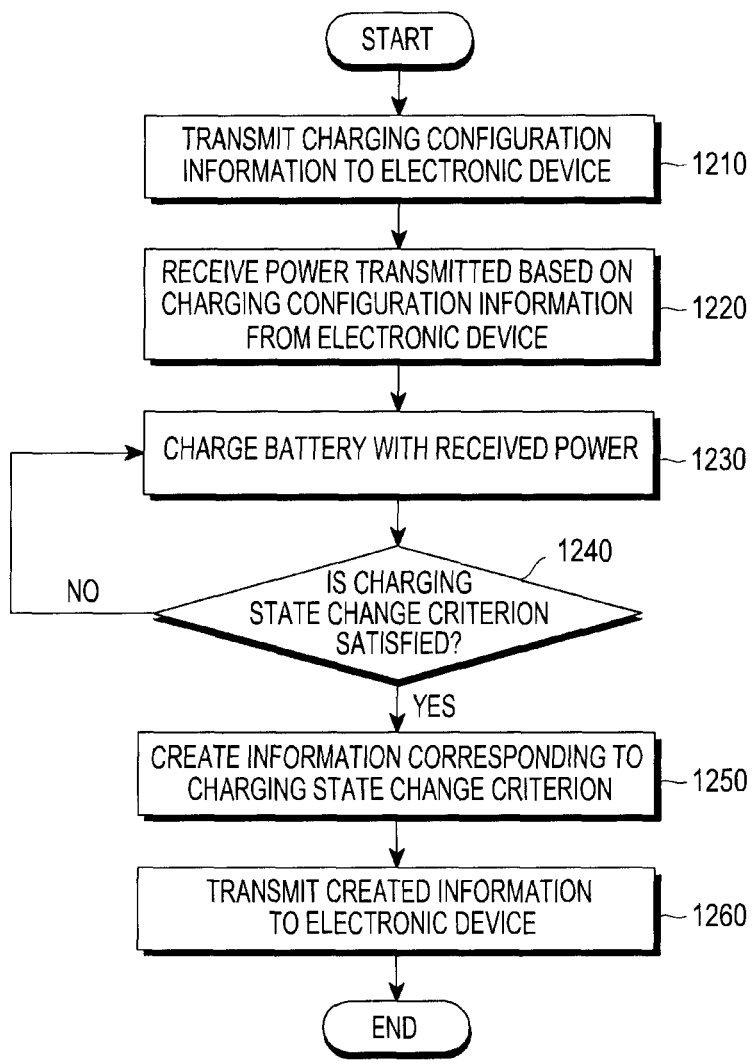
FIG. 12 is a flowchart showing a fan control method of an external electronic device, according to an embodiment of the present disclosure.

FIG. 12 is a flowchart showing a fan control method of an external electronic device, according to an embodiment of the present disclosure. The fan control method may include operations 1210 to 1260 and may be performed by at least one of: an external electronic device (e.g., the external electronic device 450); a processor of the external electronic device; or a controller (e.g., the controller 452) of the external electronic device.

In operation 1210, for example, the external electronic device (e.g., a wireless power receiver) may transmit charging configuration information to the electronic device 400 (e.g., a wireless power transmitter). Here, the electronic device 400 may generate and transmit transmission power according to the amount of power required by the external electronic device, and may be a wireless power transmitter that recognizes (verifies) that the external electronic device is a wireless power receiver that can be wirelessly charged.

According to an embodiment, the external electronic device may receive, from the electronic device 400, a verification request message for requesting verification information for wireless charging. The external electronic device may transmit, to the electronic device 400, a verification request response message in response to the verification request. The verification request response message may include identification information of the external electronic device. When the external electronic device is verified to be a receiver that can be wirelessly charged by the electronic device 400, the charging configuration information of the external electronic device may be transmitted to the electronic device 400.

According to an embodiment, the charging configuration information may include at least one of the (total) capacity of battery, battery percentage, the number of times a battery is charged, the amount of battery usage, a charging mode, or a wireless reception frequency band in the external electronic device.

In operation 1220, for example, the external electronic device may receive, from the electronic device 400, the amount of power transmitted based on the charging configuration information.

In operation 1230, for example, the external electronic device may charge the battery 451e with the transmitted amount of power received from the electronic device 400.

According to an embodiment, the charging method of the external electronic device may include a constant current (CC)-constant voltage (CV) charging method.

In operation 1240, for example, the external electronic device may determine a criterion for changing the charging state is satisfied according to a charging state change of the external electronic device based on the charged amount of power of the external electronic device in operation 1210. If the charging state change criterion is satisfied, the external electronic device may perform operation 1250. Otherwise, the external electronic device may repeat operation 1230.

For example, the external electronic device may periodically, or aperiodically, monitor whether or not the charging state of the external electronic device is changed while charging the battery 451e with the power transmitted based on the charging configuration information. The factors for determining whether or not the charging state change criterion is satisfied may include: power control information that includes the requested amount of power according to a charging method of the battery 451e, a charging mode, or the remaining amount of battery; environment information that includes at least one of temperature, illuminance, or a sound level; or time information of the external electronic device. For example, the external electronic device may periodically, or aperiodically, measure at least one of the requested amount of power, temperature, illuminance, a sound level, or time through the sensing circuit 454 and a predetermined timer (not shown). The external electronic device may compare at least one of the requested amount of power, temperature, illuminance, a sound level, or time with a predetermined corresponding threshold value in order to thereby determine whether or not the charging state is changed. If a change in the determination factors above is detected, the external electronic device may determine whether or not the detected change satisfies the charging state change criterion.

According to an embodiment, in the case where: the remaining amount of battery is changed according to the charging of the battery 451e; the charging method is converted from the constant current (CC) charging method into the constant voltage (CV) charging method; or the charging mode is changed into the high-speed charging mode or the low-speed charging mode, the external electronic device may compare a measured change value of the requested amount of power with a predetermined threshold value of the requested amount of power in order to thereby determine whether or not the configuration change criterion is satisfied.

For example, if the detected change value of the requested amount of power is equal to, or more than, a predetermined threshold value of the requested amount of power, the external electronic device may determine that the configuration change criterion has been satisfied, and if the detected change value of the requested amount of power is less than a predetermined threshold value of the requested amount of power, the external electronic device may determine that the configuration change criterion has not been satisfied.

According to an embodiment, the external electronic device may compare at least one data value of temperature data, illuminance data, time data, or sound level data, which is periodically, or aperiodically, measured by the external electronic device, with a predetermined corresponding threshold data value in order to thereby determine whether or not the configuration change criterion is satisfied.

For example, if the measured temperature data value is equal to, or more than, a predetermined temperature threshold value, the external electronic device may determine that the configuration change criterion has been satisfied, and if the measured temperature data value is less than a predetermined temperature threshold value, the external electronic device may determine that the configuration change criterion has not been satisfied.

For example, if the measured illumination data value is equal to, or less than, a predetermined illumination threshold value, the external electronic device may determine that the configuration change criterion has been satisfied, and if the measured illumination data value is more than a predetermined illumination threshold value, the external electronic device may determine that the configuration change criterion has not been satisfied.

For example, if the measured sound level data value is equal to, or more than, a predetermined sound level threshold value, the external electronic device may determine that the configuration change criterion has been satisfied, and if the measured sound level data value is less than a predetermined sound level threshold value, the external electronic device may determine that the configuration change criterion has not been satisfied. For example, the measured sound level may include a sound level that is generated by the driving of the fan 414 of the electronic device 400 during the wireless charging.

For example, if the measured time data corresponds to a predetermined period of time, the external electronic device may determine that the configuration change criterion has been satisfied, and if the measured time data does not correspond to a predetermined period of time, the external electronic device may determine that the configuration change criterion has not been satisfied. The predetermined period of time may be input or configured by a user. For example, the predetermined period of time may include a sleep period.

In operation 1250, the external electronic device may create information that includes the charging state change factors that are measured by the external electronic device.

According to an embodiment, the created information may include power control information that includes the requested amount of power measured by the external electronic device.

According to an embodiment, the created information may include environment information that includes at least one piece of temperature data, illuminance data, or sound data, which is measured by the external electronic device.

According to an embodiment, the create information may include time information that includes time data measured by the external electronic device.

In operation 1260, for example, the external electronic device may transmit, to the electronic device 400, at least one piece of the created information through the communication circuit 453.

Figure 13:
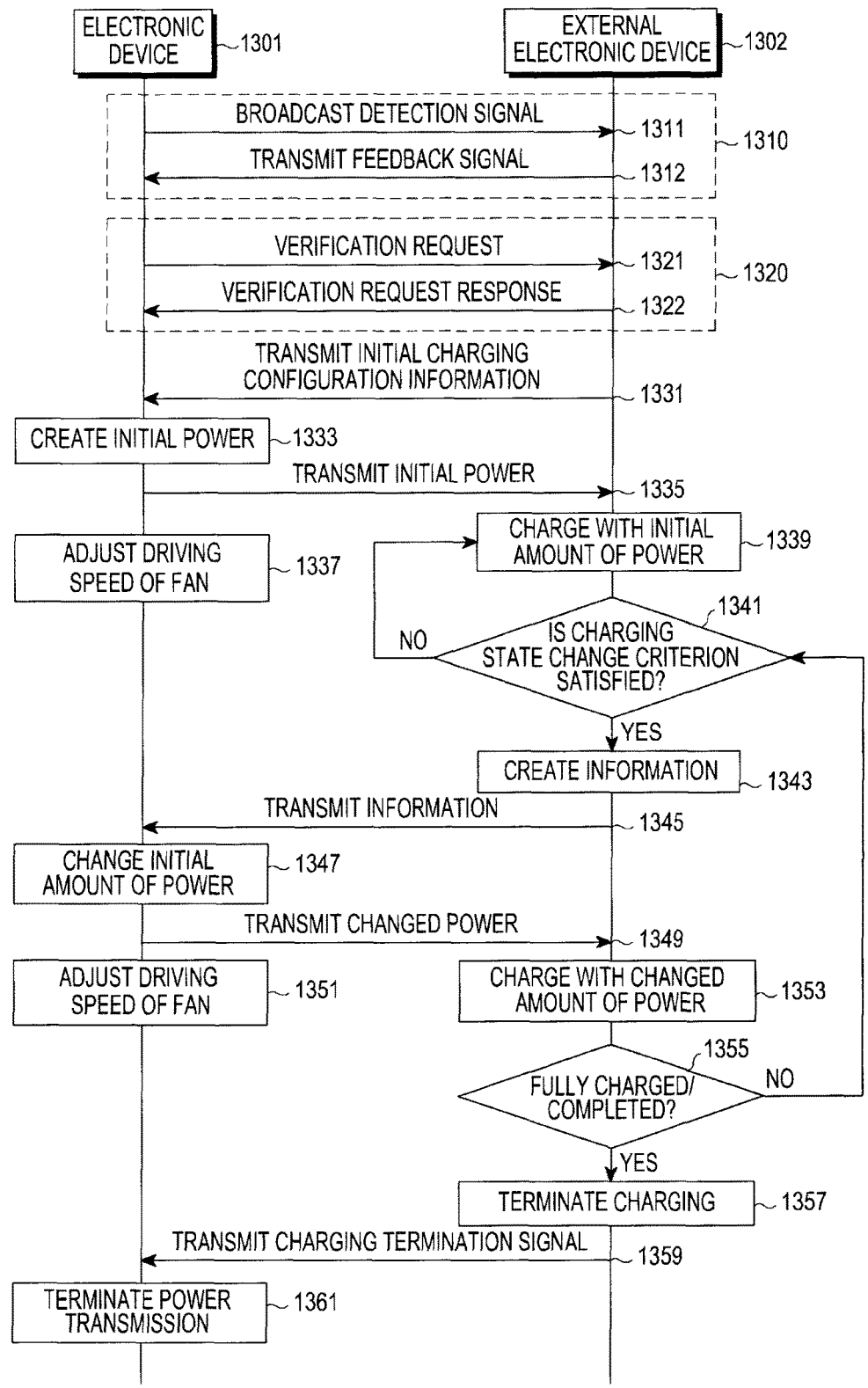
FIG. 13 is a flowchart showing a fan control method of a wireless charging system, according to an embodiment of the present disclosure.

FIG. 13 is a flowchart showing a fan control method of a wireless charging system, according to an embodiment of the present disclosure. The fan control method of a wireless charging system may include operations 1310 to 1361. The electronic device 1301 may include some or all of the elements of the electronic device 400 shown in FIG. 4. The external electronic device 1302 may include some or all of the external electronic device 450 shown in FIG. 4.

In operation 1310, for example, the electronic device 1301 (e.g., a wireless power transmitter) and the external electronic device 1302 (e.g., a wireless power receiver) may perform an operation for detecting the counterpart device for wireless charging. This detection operation may include operations 1311 and 1312 described below.

In operation 1311, for example, the electronic device 1301 may generate detection signals for detecting one or more external electronic devices (e.g., the external electronic device 1302) that can be wirelessly charged, and may broadcast the same.

In operation 1312, for example, when the external electronic device 1302 approaches the electronic device 1301, the external electronic device 1302 may transmit, to the electronic device 1301, a feedback signal for the received detection signal after receiving the broadcast detection signal.

The electronic device 1301 may receive the feedback signal that is transmitted from the electronic device external 1302. The electronic device 1301 may determine whether or not one or more external electronic devices 1302, which can be wirelessly charged, exist depending on the reception of the feedback signal.

In operation 1320, for example, the electronic device 1301 and the external electronic device 1302 (e.g., a wireless power receiver) may perform a verification operation for wireless charging. The verification operations may include operations 1321 and 1322 described below.

In operation 1321, for example, the electronic device 1301 may transmit, to the one or more detected external electronic devices 1302, a verification request message for requesting verification information for the wireless charging.

In operation 1322, for example, the external electronic device 1302 may create a verification request response message in response to the verification request message, and may transmit the same to the electronic device 1301.

According to an embodiment, the verification request response message may include identification information of the external electronic device 1302.

The electronic device 1301 may verify (recognize) that the external electronic device 1302 is a receiver that can be wirelessly charged based on the identification information included in the verification request response message received from the external electronic device 1302. For example, if the received identification information matches pre-stored identification information, the electronic device 1301 may verify that the external electronic device 1302 is a power receiver that can be wirelessly charged.

In operation 1331, for example, the external electronic device 1302 may transmit, to the electronic device 1301, charging configuration information that is related to the battery state in order to request the amount of power to be transmitted from the electronic device 1301. For example, when the external electronic device 1302 is verified to be a power receiver that can be wirelessly charged, the external electronic device 1302 may transmit the charging configuration information to the electronic device 1301.

According to an embodiment, the charging configuration information may include at least one of the total capacity of battery, battery percentage, the number of times a battery is charged, the amount of battery usage, a charging mode, a charging method, or a wireless reception frequency band in the external electronic device.

In operation 1333, for example, the electronic device 1301 may generate a transmission power based on the charging configuration information received from the external electronic device 1302.

In operation 1335, for example, the electronic device 1301 may transmit the transmission power to the external electronic device 1302.

In operation 1337, for example, the electronic device 1301 may configure the driving speed of a fan of the electronic device 1301 according to the intensity of the transmission power (that is, the amount of power). For example, as the amount of transmission power increases, the electronic device 1301 may configure to increase the driving speed of a fan.

In operation 1339, for example, the external electronic device 1302 may receive the amount of transmission power from the electronic device 1301 in order to thereby charge the battery.

In operation 1341, for example, the external electronic device 1302 may determine whether or not a criterion for a charging state change is satisfied. If the criterion for a charging state change is satisfied, the external electronic device 1302 may perform operation 1343. Otherwise, the external electronic device 1302 may repeat operation 1339.

For example, the external electronic device 1302 may periodically, or aperiodically, measure at least one of the requested amount of power, temperature, illuminance, a sound level, or time through a sensing circuit and a predetermined timer. The external electronic device may compare at least one of the requested amount of power, temperature, illuminance, a sound level, or time with a predetermined corresponding threshold value in order to thereby determine whether or not the charging state is changed. Operation 1341 may be the same as operation 1240 illustrated in FIG. 12, thus a detailed description thereof is omitted for brevity.

In operation 1343, for example, the external electronic device 1302 may create information to be transmitted to the electronic device 1301 based on at least one of the requested amount of power, temperature, illuminance, a sound level, or time, which has been measured.

According to an embodiment, the created information may include power control information that includes the requested amount of power measured by the external electronic device.

According to an embodiment, the created information may include environment information that includes at least one piece of temperature data, illuminance data, or sound data, which is measured by the external electronic device.

According to an embodiment, the created information may include time information that includes time data measured by the external electronic device.

In operation 1345, for example, the external electronic device 1302 may transmit the created information to the electronic device 1301 through a predetermined communication circuit (e.g., the communication circuit 453).

In operation 1347, for example, the electronic device 1301 may change the transmitted amount of power based on at least some of the received information.

According to an embodiment, the electronic device 1301 may change the transmitted amount of power based on the power control information among the received information. For example, the electronic device 1301 may increase or reduce the transmitted amount of power according to the requested amount of power of the power control information.

According to an embodiment, the electronic device 1301 may change the transmitted amount of power based on the environment information among the received information. For example, the electronic device 1301 may reduce or maintain the transmitted amount of power based on at least one piece of the temperature data, the illumination data, or the sound data of the environment information.

According to an embodiment, the electronic device 1301 may change the transmitted amount of power based on the time information among the received information. For example, the electronic device 1301 may reduce or maintain the transmitted amount of power according to whether or not the time data of the time information corresponds to predetermined time data (e.g., a specific period of time, such as bedtime).

In operation 1349, for example, the electronic device 1301 may transmit the changed transmission power to the external electronic device 1302.

In operation 1351, for example, the electronic device 1301 may readjust the driving speed of a fan of the electronic device 1301 based on at least some of the received information.

According to an embodiment, the electronic device 1301 may readjust the driving speed of a fan to a driving speed corresponding to the requested amount of power of the power control information among the received information.

According to an embodiment, the electronic device 1301 may readjust the driving speed of a fan in proportion to the intensity of the changed transmission power (that is, the changed amount of transmission power).

According to an embodiment, the electronic device 1301 may readjust the driving speed of a fan to a driving speed corresponding to the environment information of the received information. For example, the electronic device 1301 may readjust the driving speed of a fan to a driving speed corresponding to the received temperature data. The electronic device 1301 may readjust the driving speed of a fan to a driving speed corresponding to the received illuminance data. In addition, the electronic device 1301 may readjust the driving speed of a fan to a driving speed corresponding to the received sound data (e.g., the fan noise level).

According to an embodiment, the electronic device 1301 may readjust the driving speed of a fan to a driving speed corresponding to time information among the received information.

In operation 1353, for example, the external electronic device 1302 may receive, from the electronic device 1301, the changed amount of transmission power in order to thereby charge the battery.

In operation 1355, for example, the external electronic device 1302 may determine whether the battery is fully charged or the wireless charging is completed. If the battery is fully charged or the wireless charging is completed, the external electronic device 1302 may perform operation 1357. Otherwise, the external electronic device 1302 may repeat operation 1341.

In operation 1357, for example, the external electronic device 1302 may terminate the wireless charging.

In operation 1359, for example, the external electronic device 1302 may transmit a charging termination signal to the electronic device 1301.

In operation 1361, for example, the electronic device 1301 may receive the charging termination signal in order to thereby terminate the transmission of the amount of transmission power to the external electronic device 1302.

According to various embodiments, a fan control method of an electronic device may include: wirelessly transmitting power to an external electronic device through a coil that is disposed in the electronic device; wirelessly receiving information from the external electronic device; and adjusting the driving speed of a fan of the electronic device based on at least some of the received information.

According to various embodiments, the method may further include changing the transmitted amount of power based on at least some of the received information.

According to various embodiments, the adjusting of the driving speed of a fan may include changing the driving speed of the fan based on the changed amount of power.

According to various embodiments, the wireless receiving of the information may include wirelessly receiving the information through the coil.

According to various embodiments, the information may include at least one piece of: charging configuration information that is related to the battery state of the external electronic device; power control information that is related to the adjustment of the transmitted amount of power; environment information that is related to a charging environment of the external electronic device; or time information of the external electronic device.

According to various embodiments, the power control information may include at least one of: the requested amount of power according to a change in the charged amount of power of the battery of the external electronic device; the requested amount of power according to a change in the charging mode of the external electronic device; or the requested amount of power according to a conversion of a charging method of the external electronic device.

According to various embodiments, the adjusting of the driving speed of the fan may include comparing the requested amount of power, which has been received, with the transmitted amount of power; and readjusting the adjusted driving speed of the fan based on the comparison result.

According to various embodiments, the adjusting of the driving speed of the fan may include: reducing the transmitted amount of power and reducing the adjusted driving speed of the fan according to the changed amount of power if the requested amount of power, which has been received, is equal to, or less than, the transmitted amount of power; and increasing the transmitted amount of power and increasing the adjusted driving speed of the fan according to the changed amount of power if the requested amount of power, which has been received, exceeds the transmitted amount of power.

According to various embodiments, the environment information may include at least one piece of temperature data, illuminance data, or sound level data.

According to various embodiments, the adjusting of the driving speed of the fan may include readjusting the driving speed of the fan based on a result of comparing the received environment information with predetermined environment information.

According to various embodiments, the readjusting of the driving speed of the fan may include: reducing the transmitted amount of power if the received temperature data value is equal to, or more than, a predetermined temperature value; and reducing the driving speed of the fan according to the changed amount of power.

According to various embodiments, the readjusting of the driving speed of the fan may include: reducing the transmitted amount of power if the received illuminance data value is equal to, or less than, a predetermined illuminance value; and reducing the driving speed of the fan according to the changed amount of power.

According to various embodiments, the readjusting of the driving speed of the fan may include: reducing the transmitted amount of power if the received sound level data value is equal to, or more than, a predetermined sound level value; and reducing the driving speed of the fan according to the changed amount of power.

According to various embodiments, the readjusting of the driving speed of the fan may include: reducing the transmitted amount of power if time data of the received time information corresponds to a predetermined period of time; and reducing the driving speed of the fan according to the changed amount of power.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an Application-Specific Integrated Circuit (ASIC) chip, a Field-Programmable Gate Arrays (FPGA), and a programmable-logic device for performing operations which has been known or are to be developed hereinafter.

According to various embodiments, at least some of the devices (for example, modules or functions thereof) or the method (for example, operations) according to the present disclosure may be implemented by a command stored in a non-transitory computer-readable storage medium in a programming circuit form. The instruction, when executed by a processor (e.g., the processor 120), may cause the one or more processors to execute the function corresponding to the instruction. The computer-readable storage medium may be, for example, the memory 130.

The computer readable recoding medium may include a hard disk, a floppy disk, magnetic media (e.g., a magnetic tape), optical media (e.g., a Compact Disc Read Only Memory (CD-ROM) and a Digital Versatile Disc (DVD)), magneto-optical media (e.g., a floptical disk), a hardware device (e.g., a Read Only Memory (ROM), a Random Access Memory (RAM), a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The programming circuit according to the present disclosure may include one or more of the aforementioned components or may further include other additional components, or some of the aforementioned components may be omitted. Operations executed by a module, a programming circuit, or other component elements according to various embodiments of the present disclosure may be executed sequentially, in parallel, repeatedly, or in a heuristic manner. Further, some operations may be executed according to another order or may be omitted, or other operations may be added.

The above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

The control unit may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc.

In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for". In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

According to various embodiments, a non-transitory recording medium may store instructions that, when being executed by one or more processors, allow the one or more processors to perform operations of: wirelessly transmitting power to an external electronic device through a coil that is disposed in the electronic device; wirelessly receiving information from the external electronic device; and adjusting the driving speed of a fan of the electronic device based at least in part on at least some of the received information.

Various embodiments disclosed herein are provided merely to easily describe technical details of the present disclosure and to help the understanding of the present disclosure, and are not intended to limit the scope of the present disclosure. Accordingly, the scope of the present disclosure should be construed as including all modifications or various other embodiments based on the technical idea of the present disclosure.

What is claimed is:

1. An electronic device comprising:
   a coil;
   a first circuit;
   a second circuit;
   a fan disposed adjacent to the coil and operable to discharge heat; and
   at least one processor configured to:
   wirelessly transmit electromagnetic power to an external device via the coil using the first circuit,
   wirelessly receive information from the external device using the second circuit, and
   adjust a driving speed of the fan based at least in part on the information,
   wherein the information includes environment information including illuminance data or sound data obtained by the external device, or time information of the external device.

2. The electronic device according to claim 1, wherein the at least one processor is further configured to adjust a transmit power level based at least in part on the information.

3. The electronic device according to claim 2, wherein the at least one processor is configured to change the driving speed of the fan based on the adjusted transmit power level.

4. The electronic device according to claim 1, wherein the second circuit is configured to wirelessly receive the information via the coil.

5. The electronic device according to claim 1, further comprising a wireless communication circuit, wherein the second circuit is configured to wirelessly receive the information via the wireless communication circuit.

6. The electronic device according to claim 1, wherein the information further includes charging configuration information related to a charge level of a battery of the external device, or power control information related to an adjustment of a transmit power level.

7. The electronic device according to claim 6, wherein the charging configuration information includes at least one of a total capacity of the battery, a remaining capacity of the battery, a number of times the battery has been charged, an amount of battery usage, a charging mode, a charging method, or a wireless reception frequency band in the external device.

8. The electronic device according to claim 6, wherein the power control information includes at least one of: a requested amount of power according to a change in the charge level of the battery, a requested amount of power according to a conversion of a charging mode of the external device, or a requested amount of power according to a conversion of a charging method of the external device.

9. The electronic device according to claim 8, wherein the at least one processor is configured to readjust the adjusted driving speed of the fan based on a result of comparing the requested amount of power included in the information with the transmit power level.

10. The electronic device according to claim 9, wherein the at least one processor is configured to:
    in response to the requested amount of power being equal to or less than an amount related to the transmit power level, reduce the transmit power level and reduce the fan driving speed according to a reduced transmit power level, and
    in response to the requested amount of power exceeding the amount related to the transmit power level, increase the transmit power level and increase fan driving speed according to an increased transmit power.

11. The electronic device according to claim 1, wherein the processor is configured to:
    in response to the illuminance data value being equal to or less than a predetermined illuminance data value, reduce a transmit power level to be transmitted to the external device and reduce the fan driving speed according to the reduced transmit power level.

12. The electronic device according to claim 1, wherein the processor is configured to: in response to the sound data value being equal to or more than a predetermined sound level data value, reduce a transmit power level to be transmitted to the external device and reduce the fan driving speed according to the reduced transmit power level.

13. The electronic device according to claim 1, wherein the processor is configured to:

in response to time data of the time information corresponding to a predetermined period of time, reduce a transmit power level to be transmitted to the external device and reduce the fan driving speed according to the reduced transmit power level.

14. A control method of an electronic device having a fan, the method comprising:

wirelessly transmitting, using a first circuit of the electronic device, electromagnetic power to an external device via a coil of the electronic device;

wirelessly receiving, using a second circuit of the electronic device, information from the external device; and adjusting a driving speed of the fan based at least in part on the information, wherein the information includes environment information including illuminance data or sound data obtained by the external device, or time information of the external device.

15. The method according to claim 14, further comprising adjusting a transmit power level to be transmitted to the external device based at least in part on the information.

16. The method according to claim 15, wherein the adjusting of the driving speed of the fan comprises changing the driving speed of the fan based on the adjusted transmit power level.

17. An electronic device comprising:

a coil;

a battery;

a first circuit operatively connected to the battery;

a second circuit;

a memory; and a processor operatively coupled to the first circuit, the second circuit, and the memory;

wherein the memory stores instructions that, when executed by the processor, cause the processor to, when a wireless charging device is positioned adjacent to the coil:

wirelessly receive, using the first circuit, electromagnetic power from the wireless charging device via the coil, and transmit, to the wireless charging device via the second circuit, information, wherein the information includes environment information including illuminance data or sound data obtained by the electronic device or time information of the electronic device.

* * * * *